(12) United States Patent
Dong et al.

(10) Patent No.: US 10,734,408 B2
(45) Date of Patent: Aug. 4, 2020

(54) FERROELECTRIC NON-VOLATILE MEMORY

(71) Applicant: SanDisk Technologies LLC, Addison, TX (US)

(72) Inventors: Yingda Dong, Los Altos, CA (US); Yangyin Chen, Heverlee (BE); Yukihiro Sakotsubo, Yokkaichi (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/580,175

(22) Filed: Sep. 24, 2019

(65) Prior Publication Data

US 2020/0020704 A1    Jan. 16, 2020

Related U.S. Application Data

(62) Division of application No. 15/938,536, filed on Mar. 28, 2018, now Pat. No. 10,453,861.

(51) Int. Cl.
| | |
|---|---|
| *H01L 27/1159* | (2017.01) |
| *H01L 27/11597* | (2017.01) |
| *H01L 27/11524* | (2017.01) |
| *H01L 27/11556* | (2017.01) |
| H01L 27/11582 | (2017.01) |
| H01L 27/11519 | (2017.01) |
| H01L 27/11565 | (2017.01) |
| H01L 27/1157 | (2017.01) |
| H01L 27/11587 | (2017.01) |

(52) U.S. Cl.
CPC .... *H01L 27/1159* (2013.01); *H01L 27/11524* (2013.01); *H01L 27/11556* (2013.01); *H01L 27/11597* (2013.01); *H01L 27/1157* (2013.01); *H01L 27/11519* (2013.01); *H01L 27/11565* (2013.01); *H01L 27/11582* (2013.01); *H01L 27/11587* (2013.01)

(58) Field of Classification Search
CPC .......... H01L 27/1159; H01L 27/11524; H01L 27/11556; H01L 27/11597; H01L 27/11519; H01L 27/11565; H01L 27/1157; H01L 27/11582; H01L 27/11587; H01L 27/115–11597
See application file for complete search history.

(56) References Cited

U.S. PATENT DOCUMENTS

| | | | |
|---|---|---|---|
| 2007/0029625 A1* | 2/2007 | Lue | H01L 29/513 257/411 |
| 2010/0001335 A1 | 1/2010 | Wang et al. | |

(Continued)

OTHER PUBLICATIONS

U.S. Appl. No. 15/938,558, filed Mar. 28, 2018.

(Continued)

*Primary Examiner* — Shahed Ahmed
(74) *Attorney, Agent, or Firm* — Vierra Magen Marcus LLP

(57) ABSTRACT

A non-volatile memory system is provided that includes a plurality of NAND strings of non-volatile storage elements, each non-volatile storage element including a control gate, a tunneling layer, a floating gate, and a blocking layer including a ferroelectric material. The tunneling layer is disposed between the control gate and the floating gate, and the floating gate is disposed between the tunneling layer and the blocking layer.

13 Claims, 22 Drawing Sheets

(56) References Cited

U.S. PATENT DOCUMENTS

| | | | |
|---|---|---|---|
| 2010/0127319 A1* | 5/2010 | Lim | H01L 29/4234 257/324 |
| 2015/0179657 A1 | 6/2015 | Inumiya | |
| 2016/0284869 A1 | 9/2016 | Hattori et al. | |
| 2018/0166453 A1 | 6/2018 | Muller | |
| 2019/0131407 A1* | 5/2019 | Frank | H01L 21/82345 |
| 2019/0198617 A1* | 6/2019 | Li | H01L 29/66659 |
| 2019/0259771 A1* | 8/2019 | Chuang | H01L 23/535 |

OTHER PUBLICATIONS

U.S. Appl. No. 15/938,655, filed Mar. 28, 2018.
Restriction Requirement dated Jun. 26, 2018 in U.S. Appl. No. 15/938,655.
Response to Restriction Requirement filed Jul. 23, 2018 in U.S. Appl. No. 15/938,655.
Restriction Requirement dated Jul. 3, 2018 in U.S. Appl. No. 15/938,558.
Response to Restriction Requirement filed Jul. 17, 2018 in U.S. Appl. No. 15/938,558.
Office Action dated Oct. 11, 2018 in U.S. Appl. No. 15/938,655.
Office Action dated Oct. 11, 2018 in U.S. Appl. No. 15/938,558.
Response to Office Action filed Jan. 11, 2019 in U.S. Appl. No. 15/938,655.
Response to Office Action filed Jan. 10, 2019 in U.S. Appl. No. 15/938,558.
Office Action dated Apr. 1, 2019 in U.S. Appl. No. 15/938,655.
Office Action dated Jun. 26, 2018 in U.S. Appl. No. 15/938,536.
Response to Office Action filed Jul. 17, 2018 in U.S. Appl. No. 15/938,536.
Office Action dated Oct. 11, 2018 in U.S. Appl. No. 15/938,536.
Response to Office Action filed Jan. 10, 2019 in U.S. Appl. No. 15/938,536.
Office Action dated Apr. 1, 2019 in U.S. Appl. No. 15/938,536.
Response to Office Action filed Jun. 28, 2019 in U.S. Appl. No. 15/938,536.
Notice of Allowance and Fee(s) Due dated Jul. 31, 2019 in U.S. Appl. No. 15/938,536.

* cited by examiner

US 10,734,408 B2

FERROELECTRIC NON-VOLATILE MEMORY

PRIORITY CLAIM

This application is a divisional of U.S. patent application Ser. No. 15/938,536, entitled "FERROELECTRIC NON-VOLATILE MEMORY," filed Mar. 28, 2018, which is incorporated by reference herein in its entirety for all purposes.

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory cells store information in a charge storage region. Examples of charge storage regions include a conductive floating gate and a charge trapping region. As one example, a conductive floating gate is located between a conductive control gate and a channel region. Moreover, the floating gate is insulated from the conductive control gate and the channel region. As another example, a charge trapping region is located between a conductive control gate and a channel region.

A non-volatile memory cell can function as a transistor, with the threshold voltage of the transistor controlled by the amount of charge that is retained in the charge storage region. That is, the minimum amount of voltage that must be applied to the control gate before the transistor is turned on to make the channel region conductive may be controlled by the amount of charge in the charge storage region.

Data may be stored in a non-volatile memory cell by establishing its threshold voltage within a target range. Prior to programming certain non-volatile memory devices, such as a NAND flash memory device, the memory cells are erased. The erase operation removes electrons from the charge storage region, for some devices. Thus, the erase may lower the threshold voltage of the memory cell. Programming of the memory cells may be achieved by applying a program voltage to the control gate to raise the threshold voltage of the memory cell. Raising the threshold voltage occurs as a result of adding electrons to the charge storage region, for some devices.

BRIEF DESCRIPTION OF THE DRAWINGS

Like-numbered elements refer to common components in the different figures.

DETAILED DESCRIPTION

A non-volatile storage system with memory cells having a ferroelectric blocking layer is described. As used herein, such memory cells will be referred to as "ferroelectric non-volatile memory cells." In one embodiment, the non-volatile storage system is two-dimensional (2D) NAND. In another embodiment the non-volatile storage system is three-dimensional (3D) NAND. In one embodiment, the ferroelectric non-volatile memory cells include a charge storage region that includes a conductive floating gate. In one embodiment, the ferroelectric non-volatile memory cells include a charge storage region that includes a charge trapping region.

Figure 1A:
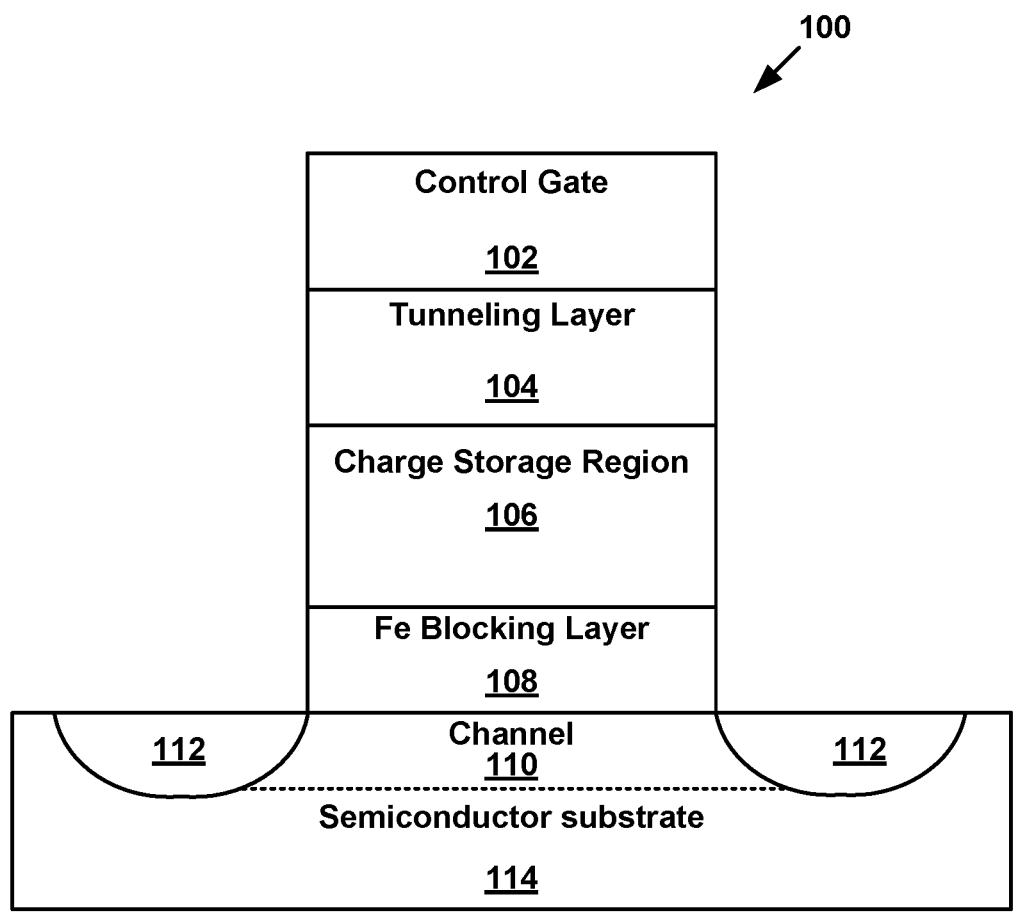
FIGS. 1A-1H are diagrams of various embodiments of a non-volatile memory cell having a ferroelectric dielectric blocking layer.

FIG. 1A is a diagram of one embodiment of a ferroelectric non-volatile memory cell 100. Memory cell 100 includes a control gate 102, a tunneling layer 104, a charge storage region 106, a blocking layer 108, a channel (e.g., semiconductor channel) 110, and source/drain regions 112. As described in more detail below, in embodiments blocking layer 108 includes a ferroelectric material, and is also referred to herein as "ferroelectric blocking layer 108." In an embodiment, the ferroelectric material includes hafnium oxide.

Semiconductor channel 110 and source/drain regions 112 are formed in a semiconductor substrate 114. Non-volatile memory cell 100 may operate as a transistor, and thus may be referred to as a "memory cell transistor." The memory cell transistor has a threshold voltage that depends on the amount of charge stored in the charge storage region 106.

Control gate 102 may be formed from a metal (e.g., tungsten) or another conductive material such as heavily doped polysilicon. Tunneling layer 104 is located between control gate 102 and charge storage region 106. Tunneling layer 104 may include one or more different dielectric materials. In one embodiment, tunneling layer 104 includes a single layer of silicon oxide (e.g., $SiO_2$). In one embodiment, tunneling layer 104 includes a triple layer of silicon oxide (e.g., $SiO_2$), a silicon nitride (e.g., $Si_3N_4$), and silicon oxide (e.g., $SiO_2$). Other materials may be used for tunneling layer 104. In embodiments, tunneling layer 104 may be between about 2 nm and about 8 nm, although other thicknesses may be used.

Figure 1B:
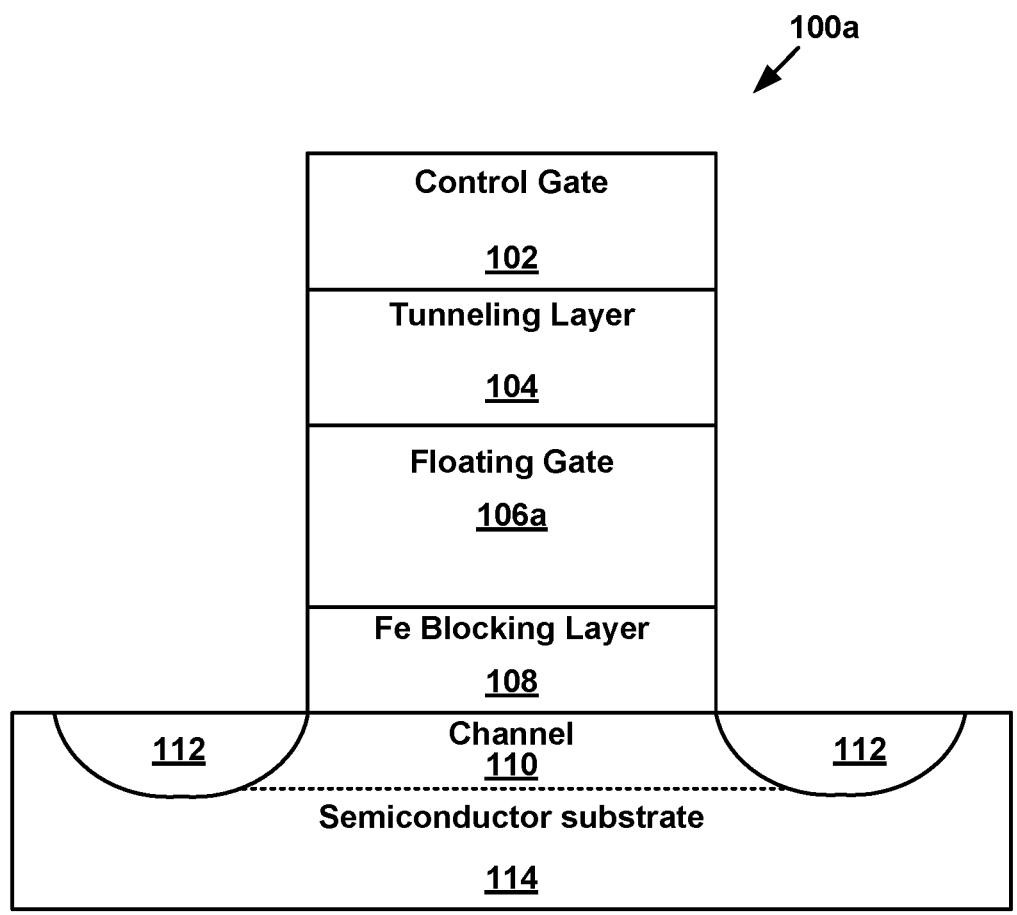

In one embodiment, charge storage region 106 is a floating gate. FIG. 1B is a diagram of one embodiment of a ferroelectric non-volatile memory cell 100a having a floating gate 106a. In embodiments, floating gate 106a may be a conductive material such as doped polysilicon (e.g., polycrystalline or amorphous semiconductor material including at least one elemental semiconductor element or at least one compound semiconductor material) or a metallic material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), and may be between about 2 nm and about 20 nm, although other floating gate materials and thicknesses may be used.

Figure 1C:
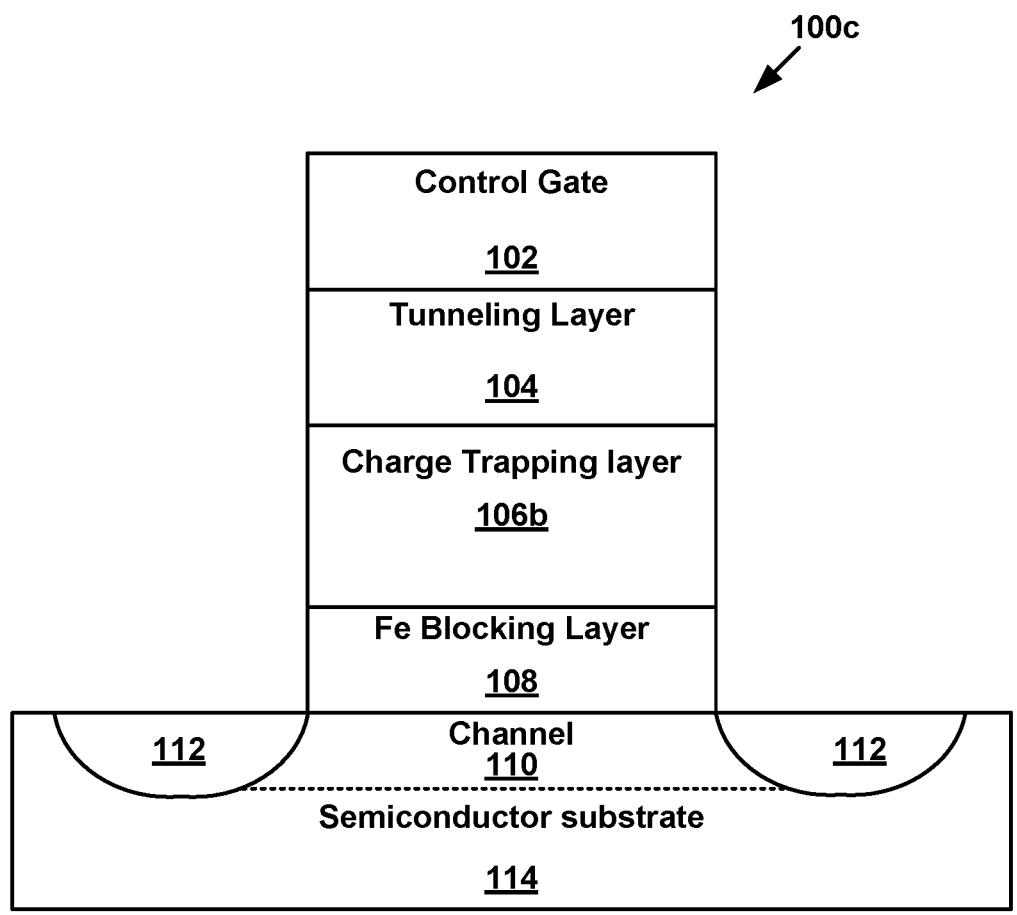

In one embodiment, charge storage region 106 is a charge trapping region. FIG. 1C is a diagram of one embodiment of a ferroelectric non-volatile memory cell 100b having a charge trapping region 106b. In embodiments, charge trapping region 106b may be a dielectric charge trapping material, such as one or more layers of a silicon nitride (e.g., $Si_3N_4$ or SiON), or optionally may be one or more layers of a ferroelectric dielectric material (described in more detail below), and may be between about 2 nm and about 20 nm, although other charge trapping materials and thicknesses may be used.

Referring again to FIG. 1A, ferroelectric blocking layer 108 is located between charge storage region 106 and semiconductor channel 110. In embodiments ferroelectric blocking layer 108 may include a ferroelectric dielectric material (described in more detail below), or may include a combination of a ferroelectric dielectric material and one or more non-ferroelectric dielectric materials (e.g., $SiO_2$, $Al_2O_3$, $HfO_2$, $ZrO_2$, $Ta_2O_5$, $Si_3N_4$, AN, transition metal nitrides or other similar dielectric materials). In embodiments, ferroelectric blocking layer 108 may be between about 10 nm and about 30 nm, although other thicknesses may be used.

Figure 2:
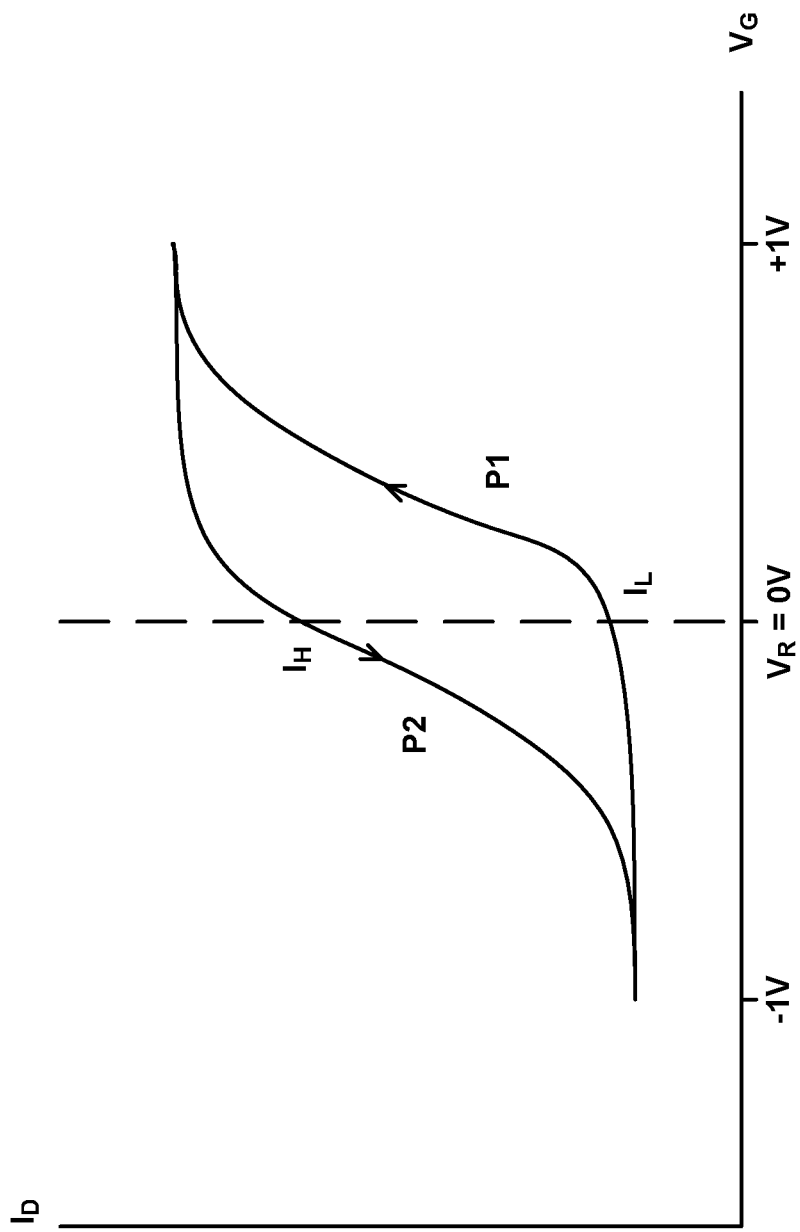
FIG. 2 depicts an example electrical characteristic of a ferroelectric field effect transistor.

FIG. 2 depicts an illustrative electrical characteristic (drain current $I_D$ versus gate voltage $V_G$) plot of a memory cell (commonly referred to as a Fe-FET memory cell) that includes a ferroelectric material as the transistor's gate dielectric. As illustrated in FIG. 2, by virtue of applying a positive or negative voltage to the gate electrode, the polarization of the Fe-FET memory cell can be flipped from a first polarization state (e.g., P1) to a second polarization state (e.g., P2). After the gate voltage is removed, the memory cell retains the polarization state. To read a selected FeFET memory cell, a read voltage VR (e.g., 0V) is applied to the gate of the selected FeFET memory cell, and the drain current of the FeFET memory cell is measured. A measured drain current of $I_H$ may correspond to a first memory state, whereas a measured drain current of $I_L$ may correspond to a second memory state.

In embodiments, the ferroelectric dielectric material includes hafnium oxide. In an embodiment, the ferroelectric dielectric material includes hafnium oxide doped with one or more of silicon, aluminum, zirconium, yttrium, gadolinium, calcium, cerium, dysprosium, erbium, germanium, scandium, and tin. In an embodiment, the hafnium oxide is doped with silicon with a concentration of about 2 to about 5 atomic %. In another embodiment, the ferroelectric dielectric material includes hafnium zirconium oxide, where the ratio of hafnium to zirconium atomic concentrations is 1 to 1. In an embodiment, the doped hafnium oxide is in a crystalline or polycrystalline morphology. The crystal grains of the doped hafnium oxide are switched, either separately or as an ensemble, between a first polarization state (e.g., P1) to a second polarization state (e.g., P2).

Referring again to FIG. 1A, during operation, one of the two source/drain regions 112 may function as the source of the memory cell transistor, and the other as the drain of the memory cell transistor. A channel 110 is labeled between the two source/drain regions 112. As is well understood, during operation of a transistor, a conductive channel forms between the two source/drain regions 112. Herein, the term "channel" or the like refers to the semiconductor region in a memory cell transistor in which a conductive channel typically forms during operation. Semiconductor substrate 114 may be formed from various types of semiconductors, including but not limited to, silicon, germanium, or a III-V compound.

In an embodiment, memory cell 100 may be programmed by biasing control gate 100 to a first voltage bias and biasing channel 110 to a second voltage bias higher than the first voltage bias. For example, the first voltage bias may be about 0V and the second voltage bias may be about 20V, although other values may be used. Without wanting to be bound by any particular theory, it is believed that when the E-field across the gate stack reaches a first threshold, electrons can tunnel through tunneling layer 104 and reach charge storage region 106.

In addition, without wanting to be bound by any particular theory, it is believed that when the E-field reaches a second threshold, the polarization of the ferroelectric dielectric material in ferroelectric blocking layer 108 will switch from a first polarization state (e.g., P1) to a second polarization state (e.g., P2). Without wanting to be bound by any particular theory, it is believed that the electron tunneling and polarization switching effects will both increase the memory cell threshold voltage.

In an embodiment, memory cell 100 may be erased by biasing control gate 100 to a third voltage bias and biasing channel 110 to a fourth voltage bias lower than the third voltage bias. For example, the third voltage bias may be about 20V and the fourth voltage bias may be about 0V, although other values may be used. Without wanting to be bound by any particular theory, it is believed that when the E-field across the gate stack reaches a third threshold, electrons in charge storage region 106 can tunnel through tunneling layer 104 and leave through control gate 102 (for a floating gate charge storage region) and holes in control gate 102 can tunnel through tunneling layer 104 and enter charge storage region 106 (for a charge-trapping layer charge storage region).

Figure 1D:
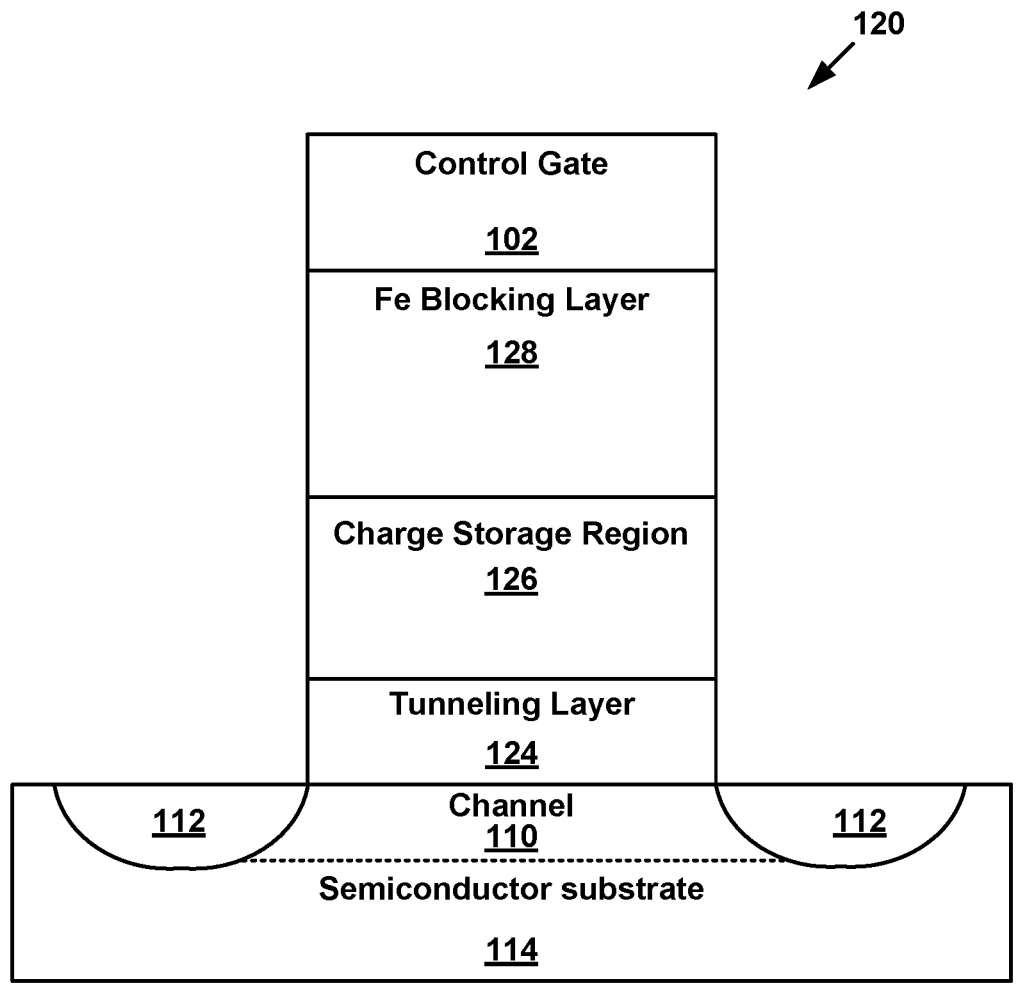

In addition, without wanting to be bound by any particular theory, it is believed that when the E-field reaches a fourth threshold, the polarization of the ferroelectric dielectric material in ferroelectric blocking layer 108 will switch from a second polarization state (e.g., P2) to a first polarization state (e.g., P1). Without wanting to be bound by any particular theory, it is believed that the electron tunneling and polarization switching effects will both decrease the memory cell threshold voltage FIG. 1D is a diagram of an embodiment of a ferroelectric non-volatile memory cell 120. Memory cell 120 includes control gate 102, ferroelectric blocking layer 128, charge storage region 126, tunneling layer 124, semiconductor channel 110, and source/drain regions 112. Ferroelectric blocking layer 128 is located between control gate 102 and charge storage region 126, and tunneling layer 124 is located between charge storage region 126 and semiconductor channel 110. Electrons can tunnel from channel 110 to charge storage region 126 during programming, in some embodiments.

In embodiments, tunneling layer 124 may include one or more of silicon dioxide ($SiO_2$), aluminum oxide ($Al_2O_3$), transition metal oxides such as $HfO_2$, $ZrO_2$ and $Ta_2O_5$, silicon nitride ($Si_3N_4$), aluminum nitride (AlN), and transition metal nitrides. Other materials may be used for tunneling layer 124. In embodiments, tunneling layer 124 may be between about 2 nm and about 6 nm, although other thicknesses may be used. In embodiments, tunneling layer 124 may include laminate and graded layers of the above-listed materials.

In one embodiment, charge storage region 126 is a floating gate, may be a conductive material such as doped polysilicon (e.g., polycrystalline or amorphous semiconductor material including at least one elemental semiconductor element or at least one compound semiconductor material) or a metallic material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), and may be between about 2 nm and about 20 nm, although other floating gate materials and thicknesses may be used.

In one embodiment, charge storage region 126 is a charge trapping region, may be a dielectric charge trapping material, such as one or more layers of a silicon nitride (e.g., $Si_3N_4$ or SiON), and may be between about 2 nm and about 20 nm, although other charge trapping materials and thicknesses may be used.

In embodiments, ferroelectric blocking layer 128 may include a ferroelectric dielectric material (e.g., hafnium oxide doped with one or more of silicon, aluminum, zirconium, yttrium, gadolinium, calcium, cerium, dysprosium, erbium, germanium, scandium, and tin, as described above), or may include a combination of a ferroelectric dielectric material and one or more non-ferroelectric dielectric materials (e.g., $SiO_2$, $Al_2O_3$, $HfO_2$, $ZrO_2$, $Ta_2O_5$, $Si_3N_4$, AlN, transition metal nitrides or other similar dielectric materials). In embodiments, ferroelectric blocking layer 128 may include laminate and graded layers of the above-listed materials. In embodiments, ferroelectric blocking layer 128 may be between about 10 nm and about 30 nm, although other thicknesses may be used.

In an embodiment, ferroelectric blocking layer 128 may include a single layer of ferroelectric dielectric material, such as shown in FIG. 1D. In other embodiments, ferroelectric blocking layer 128 may include a stacked structure of ferroelectric dielectric material and non-ferroelectric dielectric material (referred to herein as a "stacked ferroelectric blocking layer."

Figure 1E:
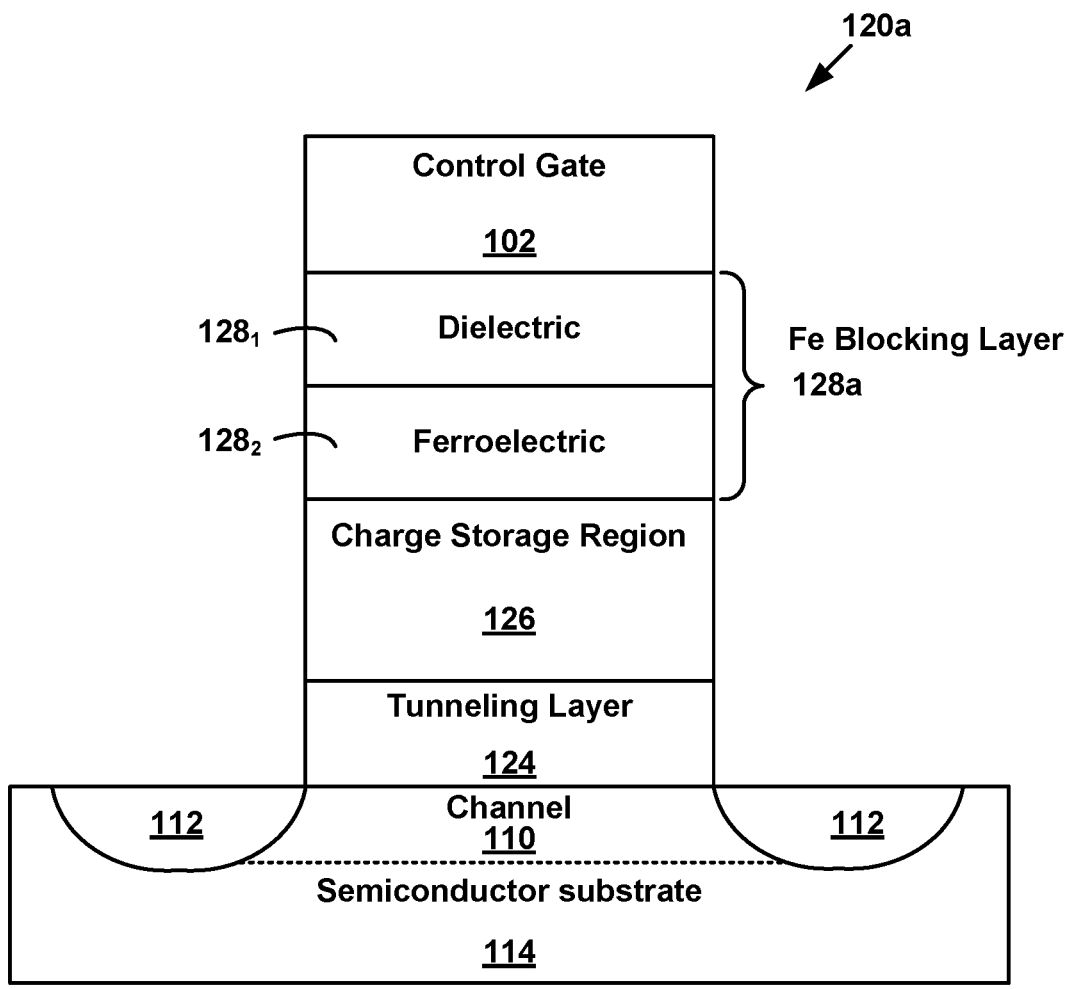

For example, FIG. 1E is a diagram of one embodiment of a ferroelectric non-volatile memory cell 120a having a stacked ferroelectric blocking layer 128a that includes a first blocking layer $128_1$ disposed on a second blocking layer $128_2$. In an embodiment, first blocking layer $128_1$ includes a non-ferroelectric dielectric material (e.g., $SiO_2$, $Al_2O_3$, $HfO_2$, $ZrO_2$, $Ta_2O_5$, $Si_3N_4$, AlN, transition metal nitrides or other similar dielectric materials), and second blocking layer $128_2$ includes a ferroelectric dielectric material (e.g., hafnium oxide doped with one or more of silicon, aluminum, zirconium, yttrium, gadolinium, calcium, cerium, dysprosium, erbium, germanium, scandium, and tin, as described above). In embodiments, first blocking layer $128_1$ may be between about 1 nm and about 10 nm, and second blocking layer $128_2$ may be between about 10 nm and about 30 nm, although other thicknesses may be used.

Figure 1F:
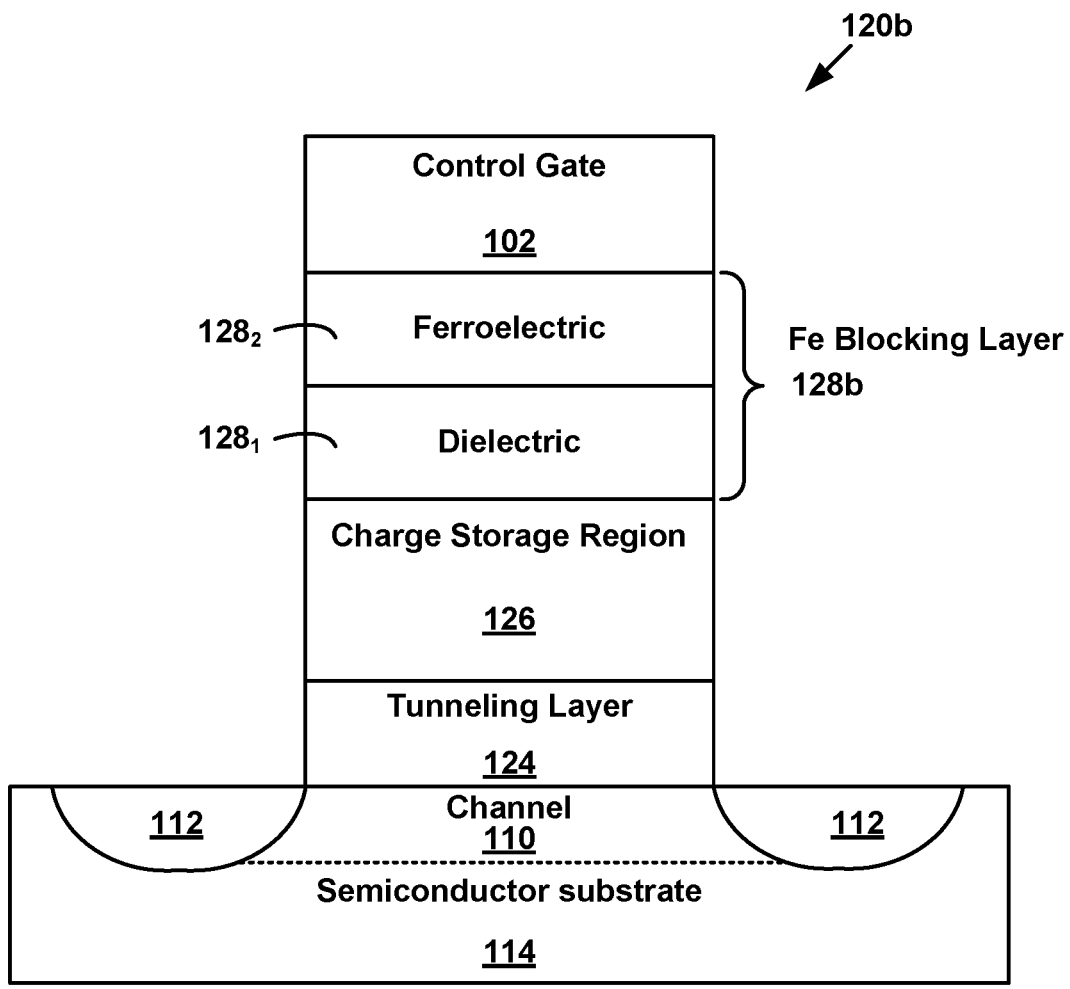

FIG. 1F is a diagram of one embodiment of a ferroelectric non-volatile memory cell 120b having a stacked ferroelectric blocking layer 128b that includes second blocking layer $128_2$ disposed on first blocking layer $128_1$. In an embodiment, first blocking layer $128_1$ includes a non-ferroelectric dielectric material (e.g., $SiO_2$, $Al_2O_3$, $HfO_2$, $ZrO_2$, $Ta_2O_5$, $Si_3N_4$, AlN, transition metal nitrides or other similar dielectric materials), and second blocking layer $128_2$ includes a ferroelectric dielectric material (e.g., hafnium oxide doped with one or more of silicon, aluminum, zirconium, yttrium, gadolinium, calcium, cerium, dysprosium, erbium, germanium, scandium, and tin, as described above).

Figure 1G:
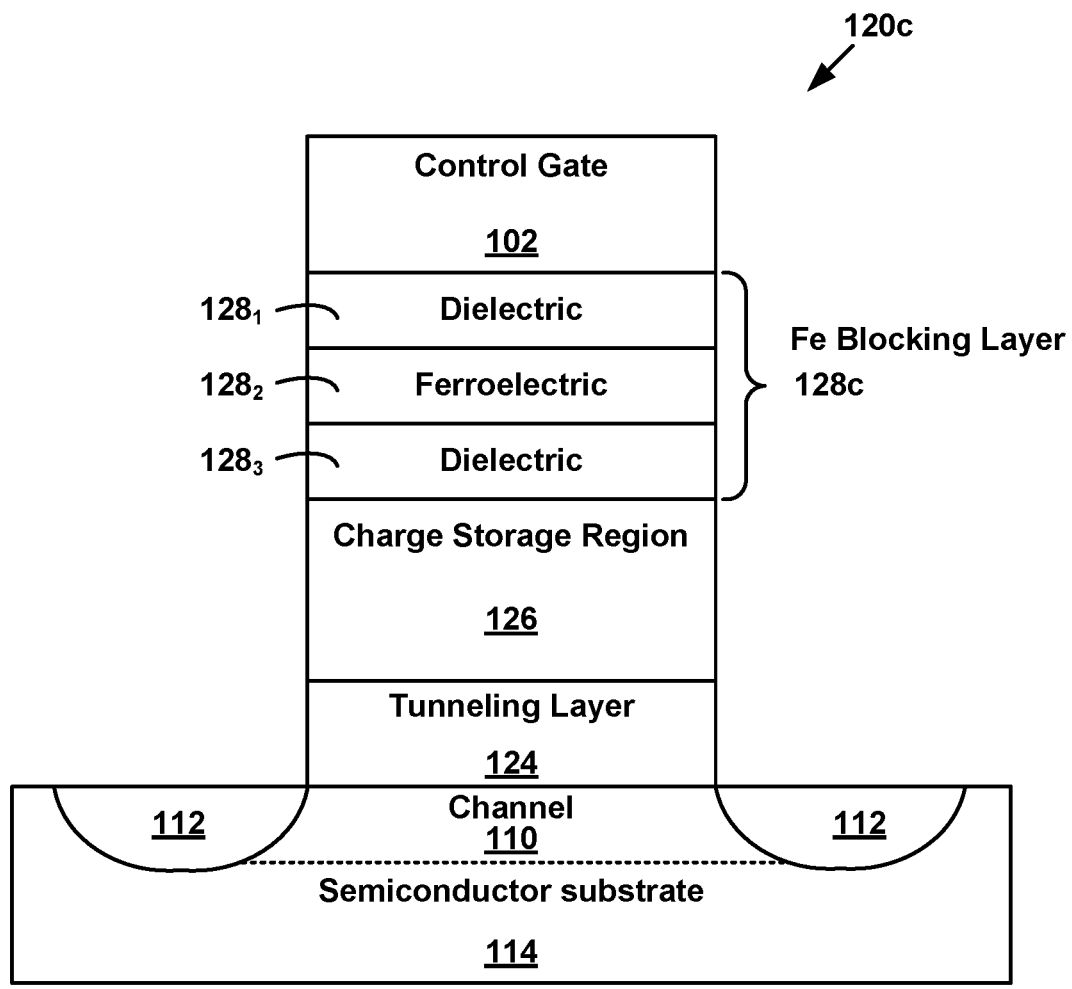

FIG. 1G is a diagram of one embodiment of a ferroelectric non-volatile memory cell 120c having a stacked ferroelectric blocking layer 128c that includes first blocking layer $128_1$ disposed on second blocking layer $128_2$, which is disposed on a third blocking layer $128_3$. In an embodiment, first blocking layer $128_1$ and third blocking layer $128_3$ each include a non-ferroelectric dielectric material (e.g., $SiO_2$, $Al_2O_3$, $HfO_2$, $ZrO_2$, $Ta_2O_5$, $Si_3N_4$, AlN, transition metal nitrides or other similar dielectric materials), and second blocking layer $128_2$ includes a ferroelectric dielectric material (e.g., hafnium oxide doped with one or more of silicon, aluminum, zirconium, yttrium, gadolinium, calcium, cerium, dysprosium, erbium, germanium, scandium, and tin, as described above). In embodiments, first blocking layer $128_1$ may be between about 1 nm and about 5 nm, second blocking layer $128_2$ may be between about 10 nm and about 30 nm, and third blocking layer $128_3$ may be between about 1 nm and about 5 nm, although other thicknesses may be used.

Figure 1H:
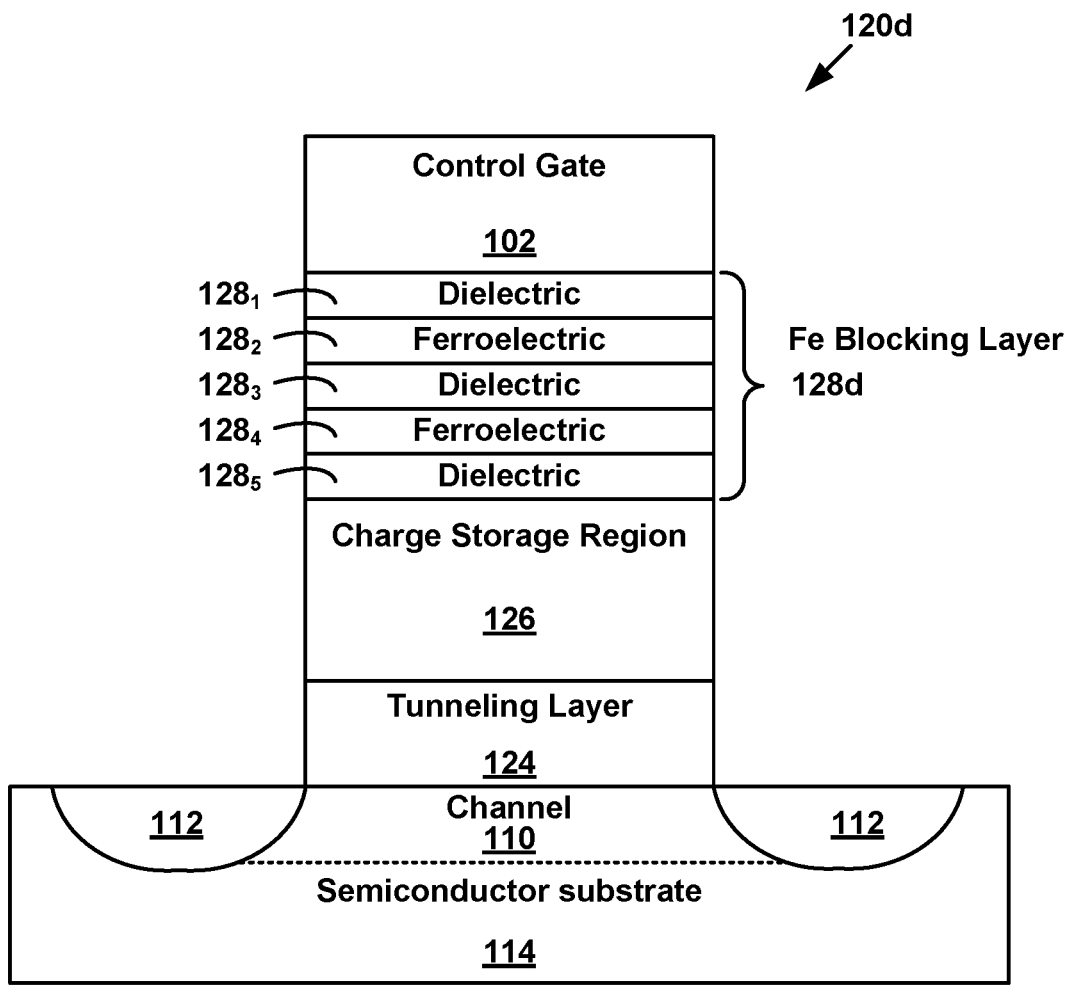

FIG. 1H is a diagram of one embodiment of a ferroelectric non-volatile memory cell 120d having a stacked ferroelectric blocking layer 128d that includes first blocking layer $128_1$ disposed on second blocking layer $128_2$, which is disposed on third blocking layer $128_3$, which is disposed on a fourth blocking layer $128_4$, which is disposed on fifth blocking layer $128_5$. In an embodiment, first blocking layer $128_1$, third blocking layer $128_3$, and fifth blocking layer $128_5$ each includes a non-ferroelectric dielectric material (e.g., $SiO_2$, $Al_2O_3$, $HfO_2$, $ZrO_2$, $Ta_2O_5$, $Si_3N_4$, AlN, transition metal nitrides or other similar dielectric materials), and second blocking layer $128_2$ and fourth blocking layer $128_4$ each includes a ferroelectric dielectric material (e.g., hafnium oxide doped with one or more of silicon, aluminum, zirconium, yttrium, gadolinium, calcium, cerium, dysprosium, erbium, germanium, scandium, and tin, as described above). In embodiments, first blocking layer $128_3$ may be between about 1 nm and about 5 nm, second blocking layer $128_2$ may be between about 5 nm and about 15 nm, third blocking layer $128_3$ may be between about 1 nm and about 5 nm, fourth blocking layer $128_4$ may be between about 5 nm and about 15 nm, and fifth blocking layer $128_5$ may be between about 1 nm and about 5 nm, although other thicknesses may be used.

Persons of ordinary skill in the art will understand that ferroelectric blocking layers may include more or fewer than five blocking layers.

Figure 3A:
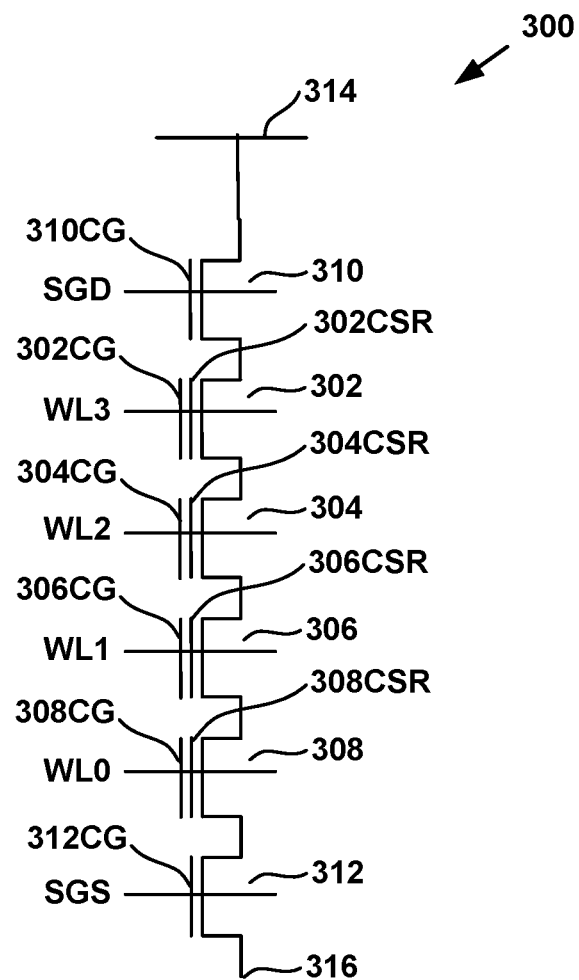
FIG. 3A is a circuit representation of a NAND string.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 3A is a circuit representation of a NAND string 300. NAND string 300 includes four memory cell transistors 302, 304, 306 and 308 in series and sandwiched between (drain side) select transistor 310 and (source side) select transistor 312. Select transistor 310 connects the NAND string to a bit line 314. Select transistor 312 connects the NAND string to source line 316.

Select transistor 310 is controlled by applying the appropriate voltages to select line SGD. The select line (SGD) is connected to a control gate terminal 310CG of the select transistor 310. Select transistor 312 is controlled by applying the appropriate voltages to select line SGS. The select line (SGS) is connected to a control gate terminal 312CG of the select transistor 312. Note that there may be more than one select transistor at each end of the NAND string, which work together as a switch to connect/disconnect the NAND string to and from the bit line and source line. For example, there may be multiple select transistors in series at each end of the NAND string.

Each of memory cell transistors 302, 304, 306 and 308 has a control gate (CG) and a charge storage region (CSR). For example, memory cell transistor 302 has control gate 302CG charge storage region 302CSR. Memory cell transistor 304 includes control gate 304CG and a charge storage region 304CSR. Memory cell transistor 306 includes control gate 306CG and charge storage region 306CSR. Memory cell transistor 308 includes a control gate 308CG and a charge storage region 308CSR. Control gate 302CG is connected to word line WL3, control gate 304CG is connected to word line WL2, control gate 306CG is connected to word line WL1, and control gate 308CG is connected to word line WL0.

Note that although FIG. 3A shows four memory cells in NAND string 300, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

Numerous types of materials can be used for the charge storage regions. In some embodiments, the charge storage regions are conductive floating gates. As one example, the conductive floating gate includes polysilicon. This may be heavily doped polysilicon. In some embodiments, the charge storage regions include non-conductive dielectric materials to store charge in a non-volatile manner.

One embodiment of memory cell 100 of FIG. 1A is part of a 2D NAND string. One embodiment of memory cell 100a of FIG. 1B is part of a 2D NAND string. One embodiment of memory cell 100c of FIG. 1C is part of a 2D NAND string. One embodiment of memory cell 120 of FIG. 1D is part of a 2D NAND string. One embodiment of memory cell 120a of FIG. 1E is part of a 2D NAND string. One embodiment of memory cell 120b of FIG. 1F is part of a 2D NAND string. One embodiment of memory cell 120c of FIG. 1G is part of a 2D NAND string. One embodiment of memory cell 120d of FIG. 1H is part of a 2D NAND string.

Figure 3B:
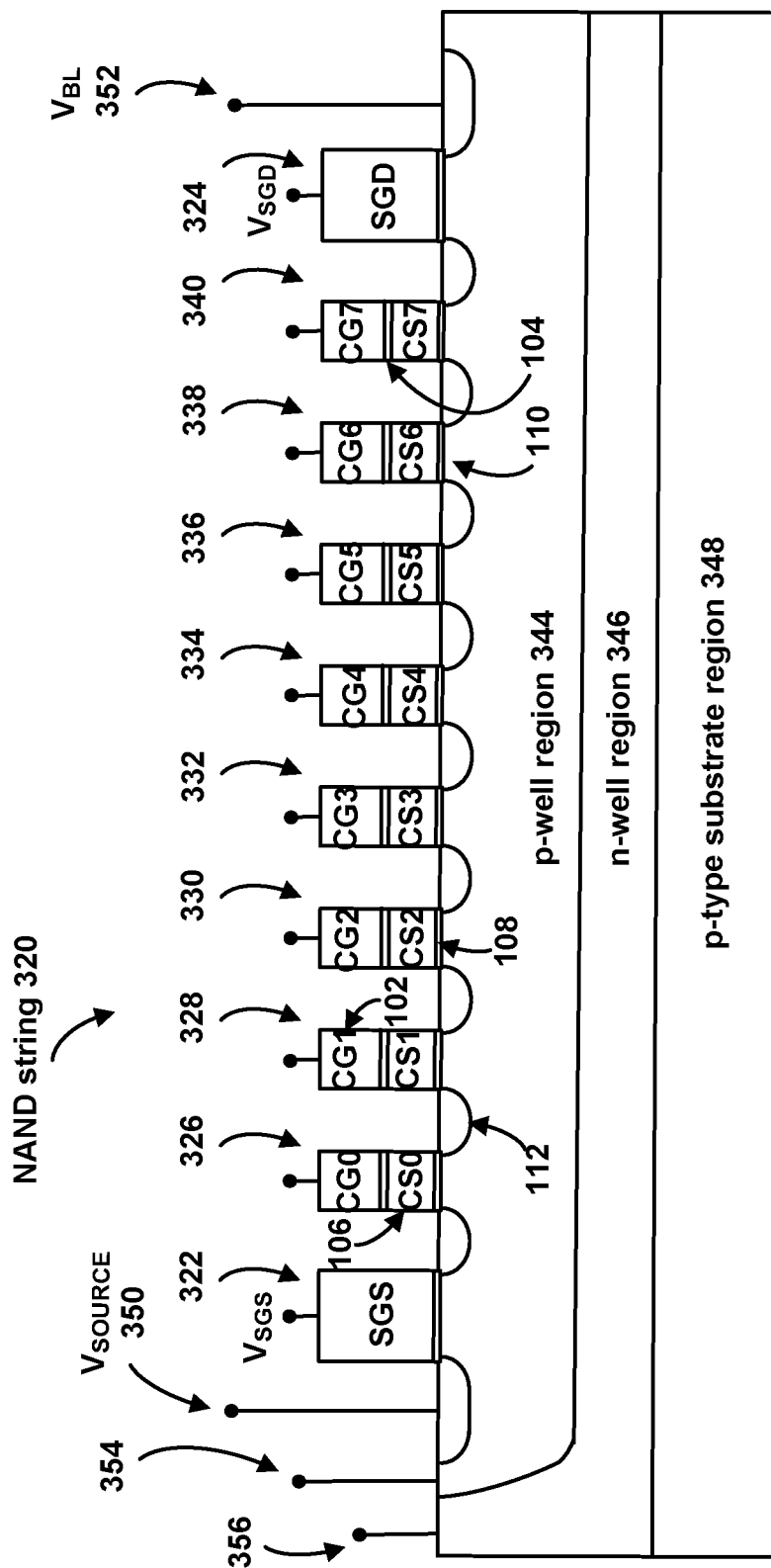
FIG. 3B depicts a cross-sectional view of a two-dimensional NAND string formed on a semiconductor substrate.

FIG. 3B depicts a cross-sectional view of a 2D NAND string 320 formed on a semiconductor substrate. The view is simplified and not to scale. The 2D NAND string 320 includes a source-side select gate 322, a drain-side select gate 324, and eight non-volatile storage elements 326, 328, 330, 332, 334, 336, 338 and 340, formed on semiconductor substrate 342. A number of source/drain regions, one example of which is source/drain region 112, are provided on either side of each storage element and the select gates 322 and 324. Each of the memory cells in FIG. 3B may be implemented with the memory cells of FIGS. 1A-1H, but is not limited to those examples.

Each memory cell includes a charge storage region (CS0-CS7) and a control gate (CG0-CG7). Each memory cell also includes a tunneling layer 104, and a ferroelectric blocking layer 108. The various ferroelectric blocking layers 108 of FIGS. 1A-1C and the various ferroelectric blocking layers 128 of FIGS. 1D-1H may be used as ferroelectric blocking layers 108 in non-volatile storage elements 326, 328, 330, 332, 334, 336, 338 and 340 in FIG. 3B.

In one embodiment, the charge storage regions (CS0-CS7) are conductive floating gates. As one example, the conductive floating gate includes heavily doped polysilicon. In one embodiment, the charge storage regions (CS0-CS7) include non-conductive dielectric materials to store charge in a non-volatile manner.

The control gates (CG0-CG7) could be formed from metal or another conductive material such as heavily doped polysilicon.

In one approach, the substrate 342 employs a triple-well technology which includes a p-well region 344 within an n-well region 346, which in turn is within a p-type substrate region 348. The 2D NAND string 320 and its non-volatile storage elements can be formed, at least in part, on p-well region 344.

A source supply line 350 with a potential of VSOURCE is provided in addition to a bit line 352 with a potential of VBL. Voltages, such as body bias voltages, can also be applied to the p-well region 344 via a terminal 354 and/or to n-well region 346 via a terminal 356. Voltages can be applied to the control gates of the memory cells during various operations (read, program, erase). VSGS and VSGD are applied to the select gates SGS 322 and SGD 324, respectively.

One embodiment of memory cell 100 of FIG. 1A resides in a 3D memory array. One embodiment of memory cell 100a of FIG. 1B resides in a 3D memory array. One embodiment of memory cell 100c of FIG. 1C resides in a 3D memory array. One embodiment of memory cell 120 of FIG. 1D resides in a 3D memory array. One embodiment of memory cell 120a of FIG. 1E resides in a 3D memory array. One embodiment of memory cell 120b of FIG. 1F resides in a 3D memory array. One embodiment of memory cell 120c of FIG. 1G resides in a 3D memory array. One embodiment of memory cell 120d of FIG. 1H resides in a 3D memory array.

Figure 4A:
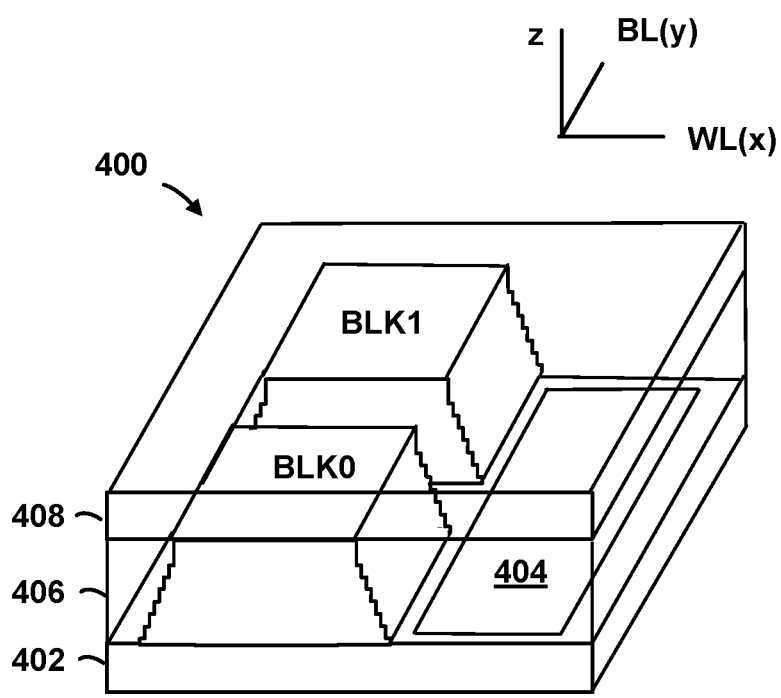
FIG. 4A is a perspective view of a three-dimensional stacked non-volatile memory device.

The various ferroelectric blocking layers 108 of FIGS. 1A-1C and the various ferroelectric blocking layers 128 of FIGS. 1D-1H may be used as ferroelectric blocking layers 108 in memory cells that reside in a 3D memory array. FIG. 4A is a perspective view of a 3D stacked non-volatile memory device 400 in which embodiments of ferroelectric blocking layers 108 of FIGS. 1A-1C and the various ferroelectric blocking layers 128 of FIGS. 1D-1H described herein may reside. The 3D memory device 400 includes a substrate 402. In one embodiment, substrate 402 is formed from silicon. Thus, substrate 402 may be a semiconductor substrate. In some embodiments, substrate 402 is crystalline silicon. In some embodiments, substrate 402 is single crystal silicon. Substrate 402 may be a semiconductor wafer.

Substrate 402 has a major surface that extends in the x-y plane. On the substrate are example blocks BLK0 and BLK1 of memory cells and a peripheral area 404 with circuitry for use by the blocks. Substrate 402 also can carry circuitry under the blocks, along with one or more lower metal layers which are patterned in conductive paths to carry signals of the circuitry. The blocks are formed in an intermediate region 406 of the memory device. The circuitry associated with operation of the memory cells may be above or within substrate 402. In one embodiment, the non-volatile memory device is monolithically formed in one or more physical levels of arrays of memory cells having an active area disposed above substrate 402.

In an upper region 408 of the memory device, one or more upper metal layers are patterned in conductive paths to carry signals of the circuitry. Each block includes a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 4B:
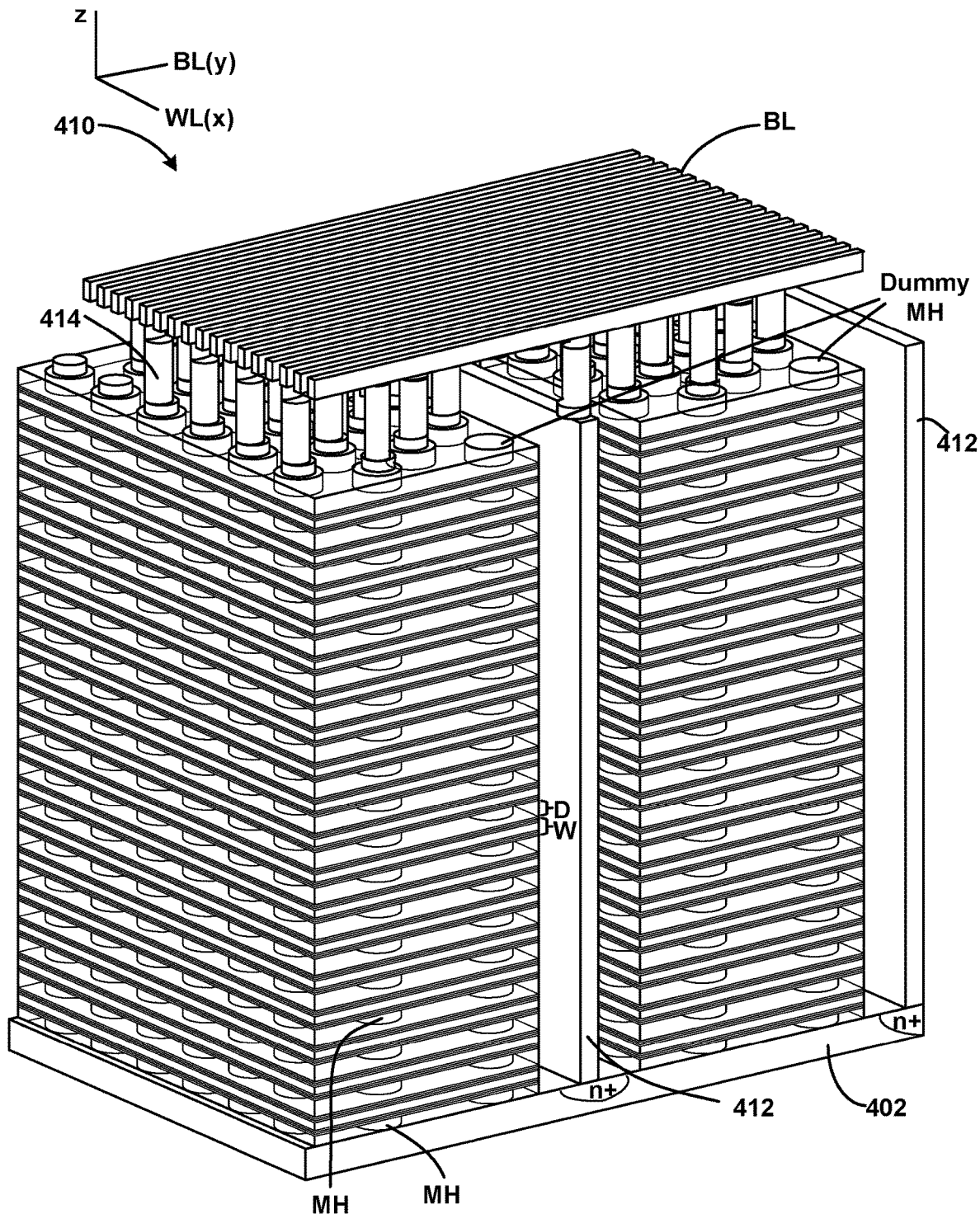
FIG. 4B is a perspective view of a portion of a monolithic three dimensional memory structure, which includes embodiments of memory cells.

FIG. 4B is a perspective view of a portion of a monolithic three dimensional memory structure 410, which includes a plurality memory cells. In one embodiment, the memory cells include the various ferroelectric blocking layers 108 of FIGS. 1A-1C and/or the various ferroelectric blocking layers 128 of FIGS. 1D-1H. The structure depicted includes a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 412.

Local source lines 412 also may be referred to as local interconnects LI. FIG. 4B only shows two fingers and two local interconnects LI. Local source lines 412 are conductive elements. Below and the alternating dielectric layers and word line layers is a substrate 402. Each local source line 412 is in electrical contact with an n+ diffusion region of substrate 402.

Memory holes are formed in the stack of alternating dielectric layers and conductive layers. For example, one of the memory holes is marked as MH. Note that in FIG. 4B, the dielectric layers are depicted as see-through so that the reader can see the memory holes positioned in the stack of alternating dielectric layers and conductive layers. In one embodiment, NAND strings are formed by filling the memory hole with materials including a charge storage layer to create a vertical column of memory cells. Each memory cell can store one or more bits of data. Two of the memory holes, which are not used for data storage, are labeled as dummies (Dummy MH).

A number of bit lines (BL) are depicted over the top of structure 410. Each bit line is connected to one of the memory holes (other than the Dummy MH) by a bit line contact 414.

Figure 4C:
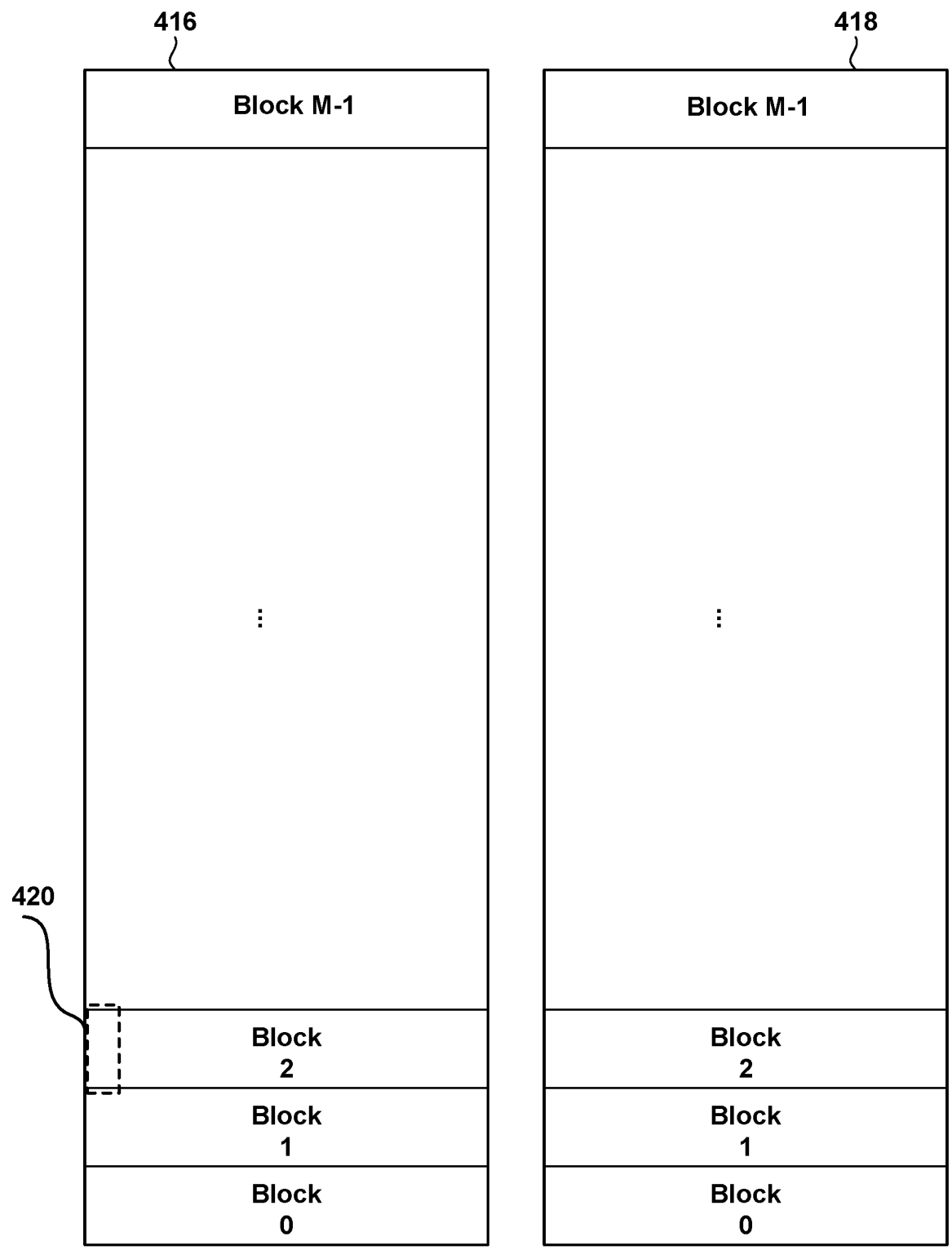
FIG. 4C is a block diagram explaining one example organization of the memory structure of FIG. 4B.

FIG. 4C is a block diagram explaining one example organization of memory structure 410, which is divided into two planes 416 and 418. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane. Therefore, plane 416 includes block 0, 2, 4, 6, . . . and plane 418 includes blocks 1, 3, 5, 7, . . . .

Figure 4D:
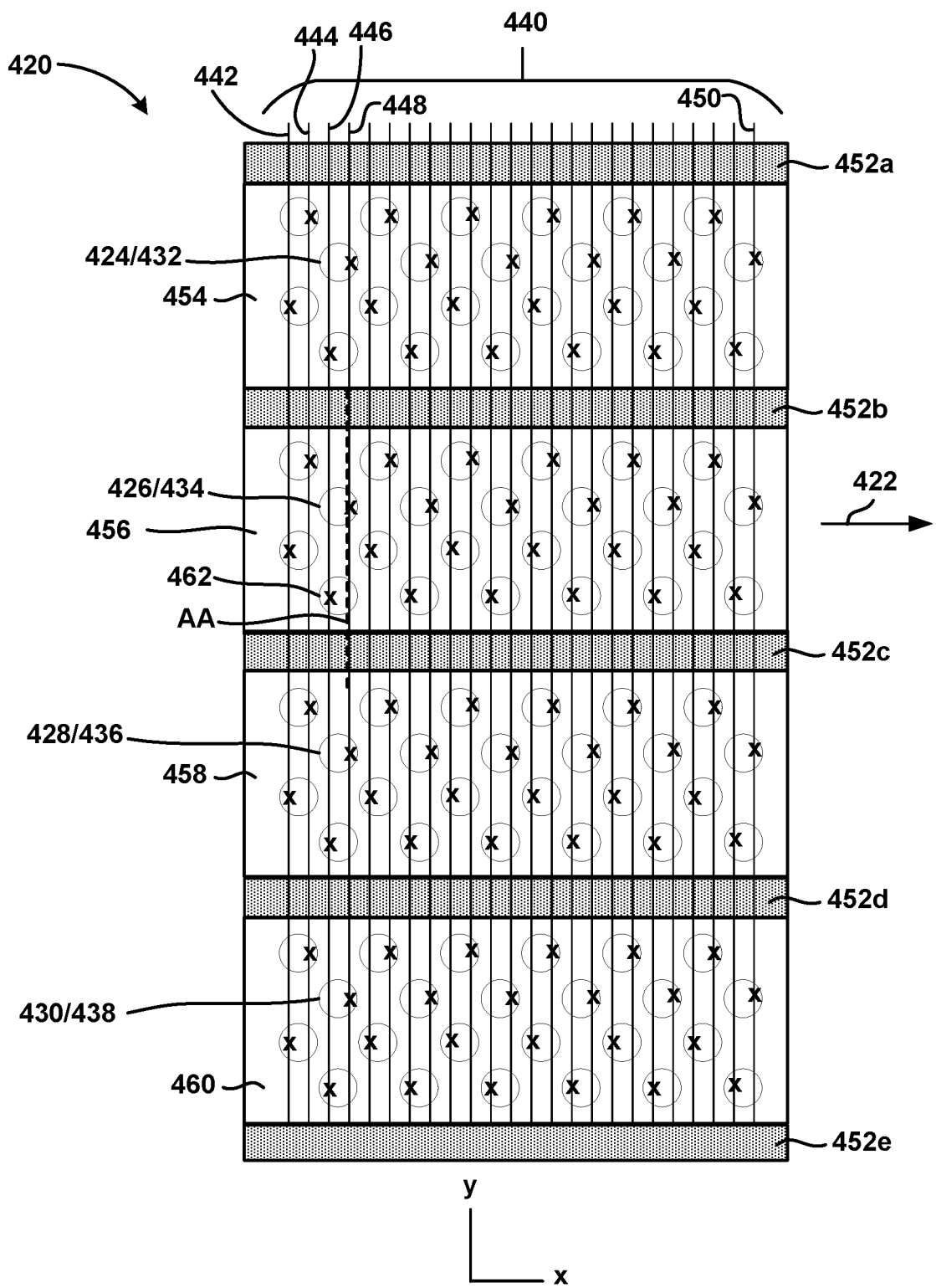
FIGS. 4D-4E depict an example three-dimensional NAND structure.
Figure 4E:
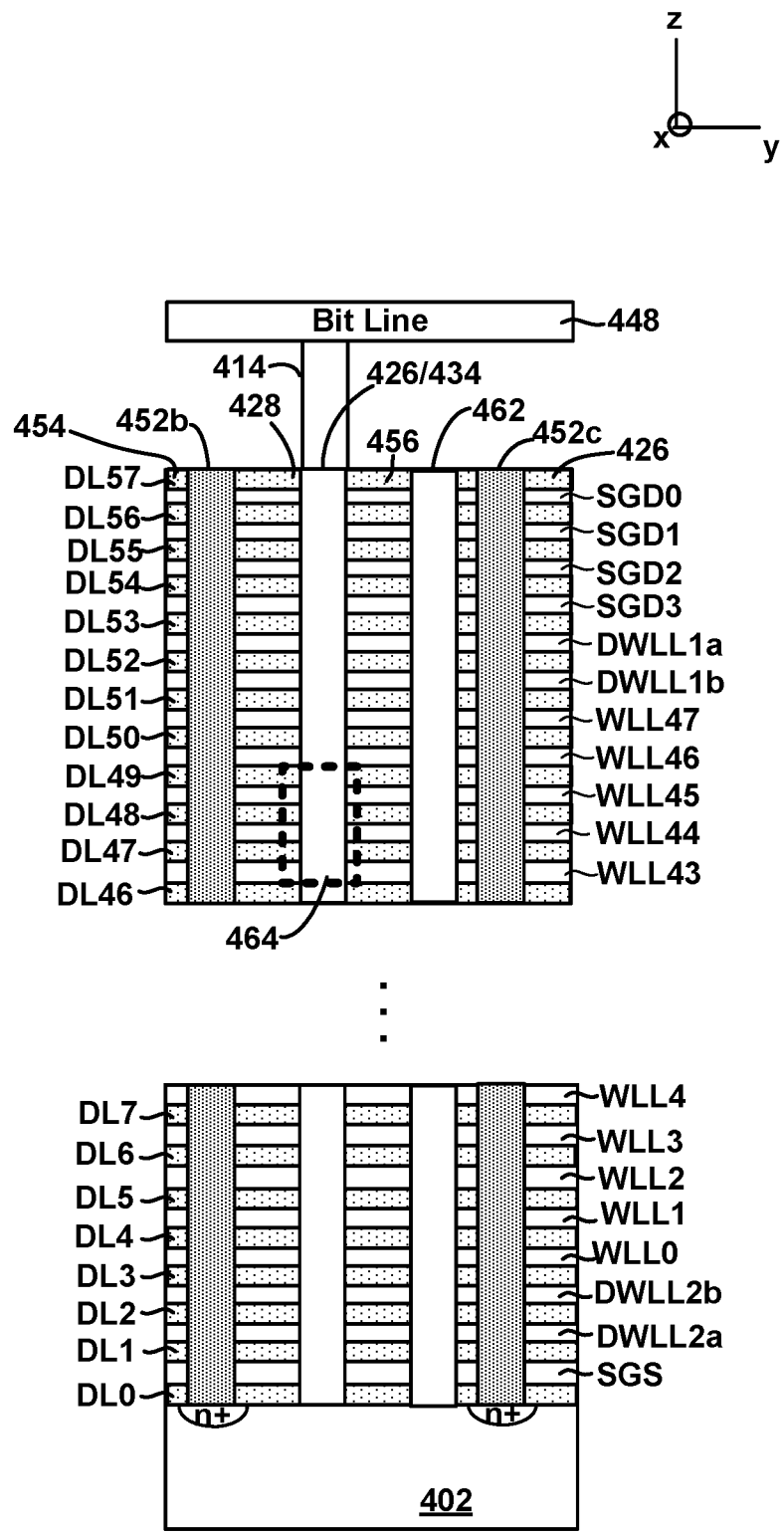

FIGS. 4D-4E depict an example 3D NAND structure. FIG. 4D is a block diagram depicting a top view of a portion of one block from memory structure 410. The portion of the block depicted in FIG. 4D corresponds to portion 420 in block 2 of FIG. 4C. As can be seen from FIG. 4D, the block depicted in FIG. 4C extends in a direction 422. In one embodiment, the memory array will have 60 layers. Other embodiments have less than or more than 60 layers. However, FIG. 4D only shows the top layer.

FIG. 4D depicts a plurality of circles that represent the vertical columns. Each of the vertical columns include multiple select transistors and multiple memory cells. In one embodiment, each vertical column implements a NAND string. For example, FIG. 4D depicts vertical columns 424, 426, 428 and 430. Vertical column 424 implements NAND string 432. Vertical column 426 implements NAND string 434. Vertical column 428 implements NAND string 436. Vertical column 430 implements NAND string 438. More details of the vertical columns are provided below. Since the block depicted in FIG. 4D extends in the direction of arrow 422, the block includes more vertical columns than depicted in FIG. 4D.

FIG. 4D also depicts a set of bit lines 440, including bit lines 442, 444, 446, 448, . . . 450. FIG. 4D shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 448 is connected to vertical columns 424, 426, 428 and 430.

The block depicted in FIG. 4D includes a set of local source lines 452a, 452b, 452c, 452d, 452e. Local source lines may also be referred to as "local interconnects." Local interconnects 452 also serve to divide each layer of the block into four regions; for example, the top layer depicted in FIG. 4B is divided into regions 454, 456, 458 and 460, which are referred to as fingers. In the layers of the block that implement memory cells, the four regions are referred to as word line fingers that are separated by the local interconnects.

In one embodiment, the word line fingers on a common level of a block connect together at the end of the block to form a single word line. In another embodiment, the word line fingers on the same level are not connected together. In one example implementation, a bit line only connects to one vertical column in each of regions 454, 456, 458 and 460. In that implementation, each block has sixteen rows of active columns and each bit line connects to four rows in each block.

In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4D shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4D also shows the vertical columns being staggered. In other embodiments, different patterns of staggering can be used. In some embodiments, the vertical columns are not staggered.

FIG. 4E depicts a portion of an embodiment of three dimensional memory structure 410 showing a cross-sectional view along line AA of FIG. 4D. This cross sectional view cuts through vertical columns 426 and 462 and region 456 (see FIG. 4D). The structure of FIG. 4E includes four drain side select layers SGD0, SGD1, SGD2 and SGD3, one source side select layer SGS, four dummy word line layers DWLL1a, DWLL1b, DWLL2a and DWLL2b, and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers).

Vertical columns 426 and 462 are depicted protruding through the drain side select layers, source side select layer, dummy word line layers and word line layers. In one embodiment, each vertical column includes a NAND string. For example, vertical column 426 includes NAND string 434. Below the vertical columns and the layers listed below is crystalline silicon substrate 402. Substrate 402 is single crystal silicon, in some embodiments. The local source lines 452b, 452c are in direct electrical contact with an n+ region of substrate 402, in this embodiment. The NAND string of vertical column 426 has a source end at a bottom of the stack and a drain end at a top of the stack. As in agreement with FIG. 4D, FIG. 4E show vertical column 426 connected to Bit Line 448 via bit line contact 414.

For ease of reference, drain side select layers SGD0, SGD1, SGD2 and SGD3, source side select layer SGS, dummy word line layers DWLL1a, DWLL1b, DWLL2a and DWLL2b, and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide.

In some embodiments, different conductive layers can be formed from different materials. Alternating with the conductive layers are dielectric layers DL0-DL57. For example, dielectric layer DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells.

A dummy memory cell does not store user data, while a data memory cell is eligible to store user data. However, structurally dummy and data memory cells are the same, in some embodiments. Drain side select layers SGD0, SGD1, SGD2 and SGD3 are used to electrically connect and disconnect NAND strings from bit lines. Source side select layer SGS is used to electrically connect and disconnect NAND strings from the source lines 452b, 452c.

Figure 4F:
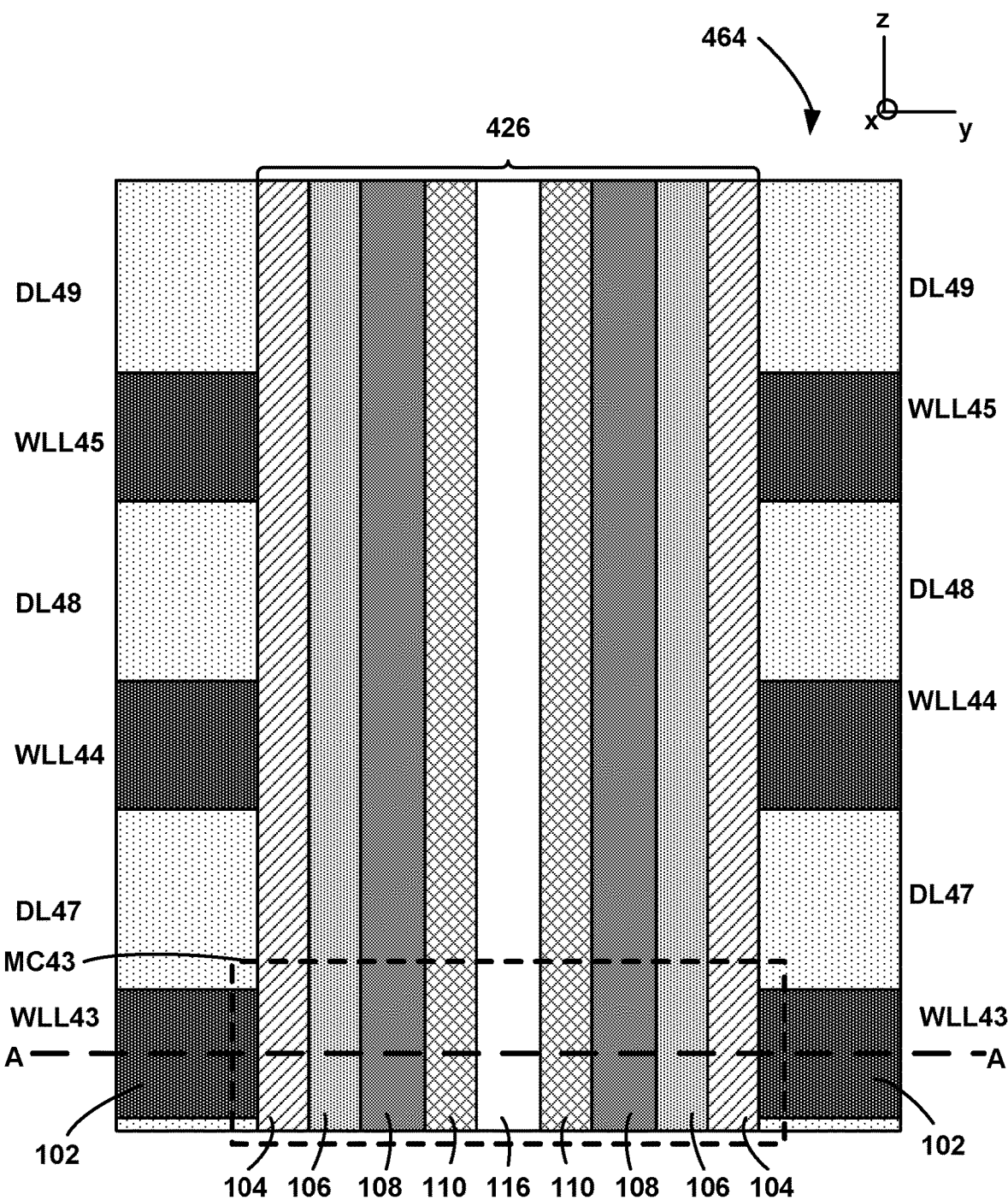
FIG. 4F depicts a close-up view of one embodiment of a region of FIG. 4E.
Figure 4G:
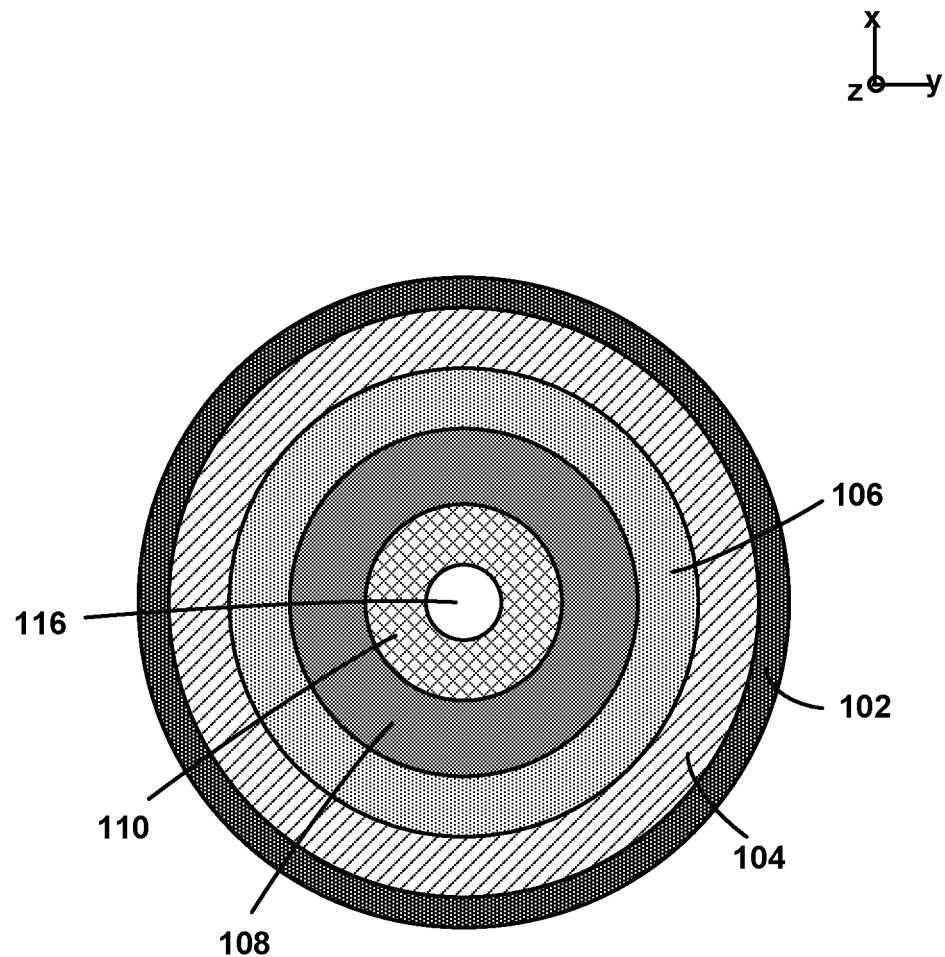
FIG. 4G depicts a horizontal cross section along line A-A' of FIG. 4F.

A region 464 of NAND string 434 is highlighted. FIG. 4F depicts a close-up view of one embodiment of region 464 of FIG. 4E, which includes column 426 of FIG. 4E. FIG. 4G depicts a horizontal cross section along line A-A' of FIG. 4F. In one embodiment, the vertical columns 426 are round in horizontal cross section, although other shapes can be used. In one embodiment, vertical column 426 includes channel 110, tunneling layer 104, charge storage layer 106, and ferroelectric blocking layer 108. In embodiments, ferroelectric blocking layer 108 includes a ferroelectric dielectric material (e.g., hafnium oxide doped with one or more of silicon, aluminum, zirconium, yttrium, gadolinium, calcium, cerium, dysprosium, erbium, germanium, scandium, and tin, as described above).

Channel 110 is a semiconductor such as, silicon, SiGe, or a III-V type semiconductor. Vertical column 426 also include an inner core layer 116 made of a dielectric (e.g., $SiO_2$) inside semiconductor channel 110.

In one embodiment, the charge storage region 106 is a charge trapping region. In one embodiment, charge storage region 106 is a floating gate.

FIG. 4F depicts dielectric layers DL47, DL48, and DL49, as well as layers WLL43, WLL44, and WLL45. The physical interaction of a word line layer (WLL43, WLL44, or WLL45) with the vertical column forms a memory cell. In FIG. 4F memory cell MC43 is pointed out by a dashed box. Thus, in one embodiment a memory cell includes control gate 102, tunneling layer 104, charge storage layer 106, ferroelectric blocking layer 108 and channel 110. In other architectures, a memory cell may have a different structure. However, the memory cell would still be the storage unit.

When a memory cell is programmed, electrons are stored in charge storage layer 106 associated with the memory cell. These electrons are drawn into charge storage region 106 from the channel 110, through tunneling dielectric 104, in response to an appropriate voltage on control gate 102. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge storage layer to recombine with electrons. In one embodiment, erasing is achieved using hole injection into the charge storage layer via a physical mechanism such as gate induced drain leakage (GIDL).

Figure 4H:
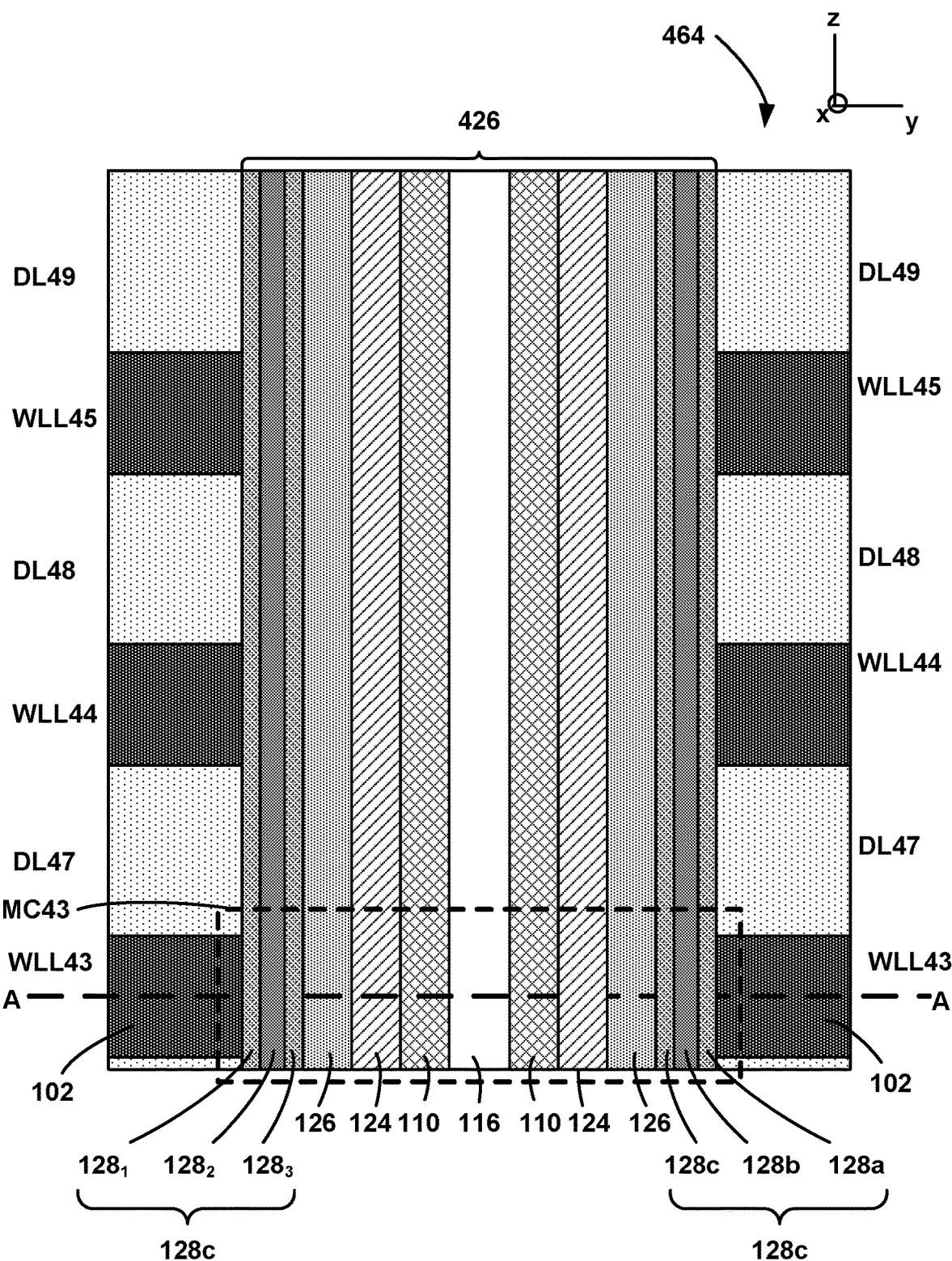
FIG. 4H depicts a close-up view of another embodiment of a region of FIG. 4E.
Figure 4I:
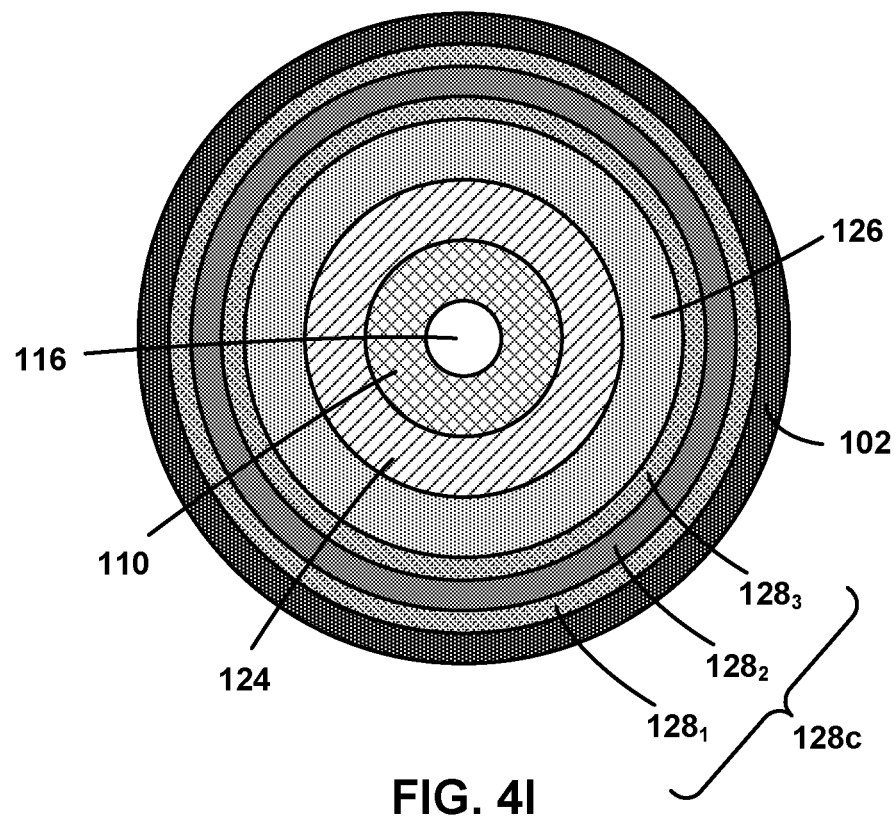
FIG. 4I depicts a horizontal cross section along line A-A' of FIG. 4H.

FIG. 4H depicts a close-up view of another embodiment of region 464 of FIG. 4E, which includes column 426 of FIG. 4E. FIG. 4I depicts a horizontal cross section along line A-A' of FIG. 4H. In one embodiment, the vertical columns 426 are round in horizontal cross section, although other shapes can be used. In one embodiment, vertical column 426 includes channel 110, tunneling layer 124, charge storage layer 126, and ferroelectric blocking layer 128c, such as depicted in FIG. 1G.

In an embodiment, ferroelectric blocking layer 128c includes a first blocking layer 128$_1$, a second blocking layer 128$_2$, and a third blocking layer 128$_3$. In an embodiment, first blocking layer 128$_1$ and third blocking layer 128$_3$ each include a non-ferroelectric dielectric material (e.g., SiO$_2$, Al$_2$O$_3$, HfO$_2$, ZrO$_2$, Ta$_2$O$_5$, Si$_3$N$_4$, transition metal nitrides or other similar dielectric materials), and second blocking layer 128$_2$ includes a ferroelectric dielectric material (e.g., hafnium oxide doped with one or more of silicon, aluminum, zirconium, yttrium, gadolinium, calcium, cerium, dysprosium, erbium, germanium, scandium, and tin, as described above).

Channel 110 is a semiconductor such as, silicon, SiGe, or a III-V type semiconductor. Vertical column 426 also include an inner core layer 116 made of a dielectric (e.g., SiO$_2$) inside semiconductor channel 110.

In one embodiment, the charge storage region 126 is a charge trapping region. In one embodiment, charge storage region 126 is a floating gate.

FIG. 4H depicts dielectric layers DL47, DL48, and DL49, as well as layers WLL43, WLL44, and WLL45. The physical interaction of a word line layer (WLL43, WLL44, or WLL45) with the vertical column forms a memory cell. In FIG. 4H memory cell MC43 is pointed out by a dashed box. Thus, in one embodiment a memory cell includes control gate 102, tunneling layer 124, charge storage layer 126, ferroelectric blocking layer 128c and channel 110. In other architectures, a memory cell may have a different structure. However, the memory cell would still be the storage unit.

When a memory cell is programmed, electrons are stored in charge storage layer 126 associated with the memory cell. These electrons are drawn into charge storage region 126 from the channel 110, through tunneling dielectric 124, in response to an appropriate voltage on control gate 102. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge storage layer to recombine with electrons. In one embodiment, erasing is achieved using hole injection into the charge storage layer via a physical mechanism such as gate induced drain leakage (GIDL).

Figure 5A:
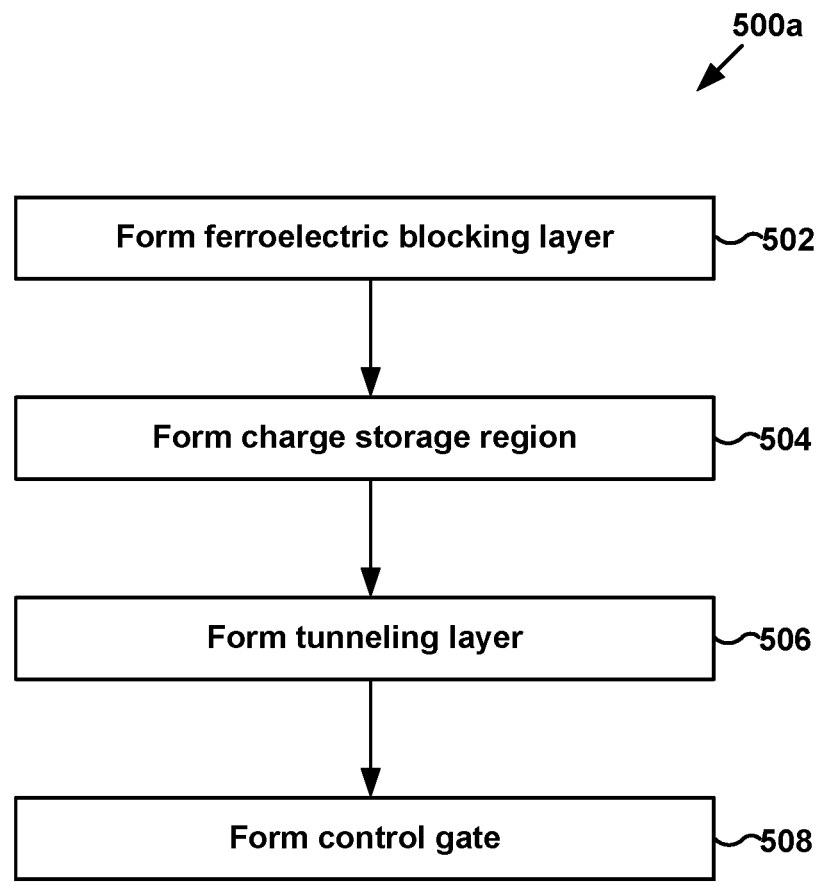
FIG. 5A is a flowchart of one embodiment of a process of fabricating a non-volatile storage element.

FIG. 5A is a flowchart of one embodiment of a process 500a of fabricating a non-volatile storage element. The non-volatile storage element may be fabricated in a 2D or 3D memory array. The non-volatile storage element may be part of a NAND string. Process 500a may be used to form memory cells including, but not limited to, those depicted in FIGS. 1A-1C. The memory cell may have a ferroelectric blocking layer including, but not limited to, those depicted in FIGS. 1A-1C.

Step 502 includes forming a ferroelectric blocking layer 108. Ferroelectric blocking layer 108 may be formed adjacent to a semiconductor channel 110.

Step 504 includes forming a charge storage region 106.

Step 506 includes forming a tunneling layer 104.

Step 508 includes forming a control gate 102. Tunneling layer 104 is located between control gate 102 and charge storage region 106. Charge storage region 106 is located between tunneling layer 104 and ferroelectric blocking layer 108.

Figure 5B:
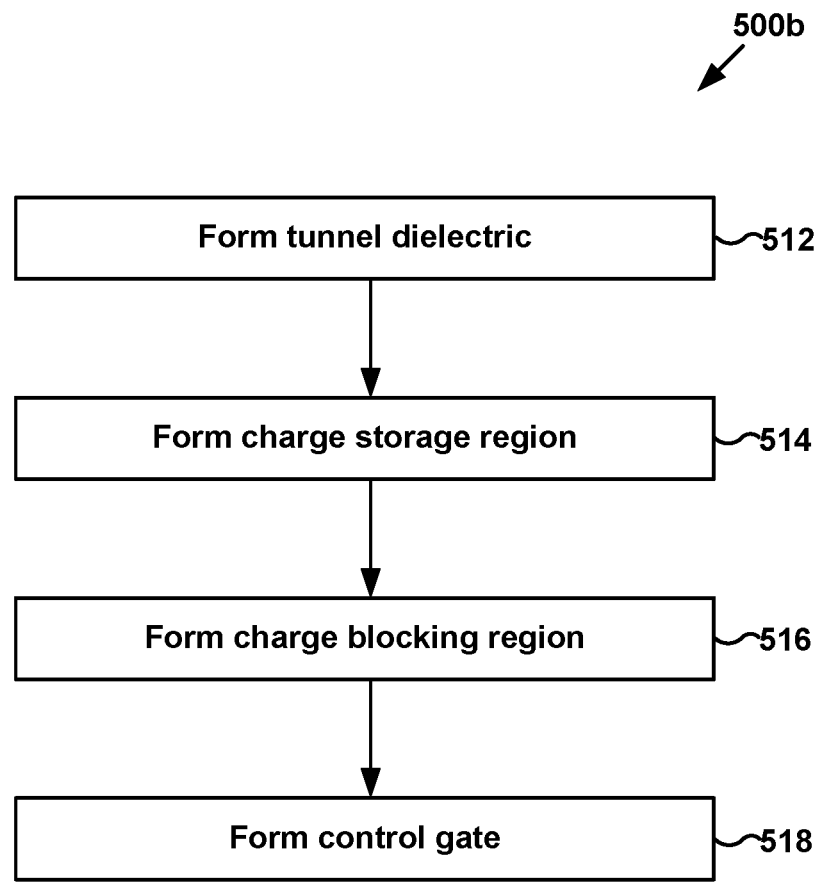
FIG. 5B is a flowchart of another embodiment of a process of fabricating a non-volatile storage element.

FIG. 5B is a flowchart of an embodiment of a process 500b of fabricating a non-volatile storage element. The non-volatile storage element may be fabricated in a 2D or 3D memory array. The non-volatile storage element may be part of a NAND string. Process 500b may be used to form memory cells including, but not limited to, those depicted in FIGS. 1D-1H. The memory cell may have a ferroelectric blocking layer including, but not limited to, those depicted in FIGS. 1D-1H.

Step 512 includes forming a tunneling layer 124. Tunneling layer 124 may be formed adjacent to a semiconductor channel 110.

Step 514 includes forming a charge storage region 126.

Step 506 includes forming a ferroelectric blocking layer 128.

Step 518 includes forming a control gate 102. Ferroelectric blocking layer 128 is located between control gate 102 and charge storage region 126. Charge storage region 126 is located between tunneling layer 124 and ferroelectric blocking layer 128.

One embodiment includes a non-volatile storage element including a control gate, a tunneling layer, a charge storage region, and a blocking layer including a ferroelectric material. The tunneling layer is disposed between the control gate and the charge storage region, and the charge storage region is disposed between the tunneling layer and the blocking layer.

One embodiment includes a non-volatile memory system including a plurality of NAND strings of non-volatile storage elements, each non-volatile storage element including a control gate, a tunneling layer, a floating gate, and a blocking layer including a ferroelectric material. The tunneling layer is disposed between the control gate and the floating gate, and the floating gate is disposed between the tunneling layer and the blocking layer.

One embodiment includes a monolithic three-dimensional memory structure including a plurality of memory cells, each memory cell including a control gate, a tunneling layer, a floating gate, and a blocking layer including a ferroelectric material. The tunneling layer is disposed between the control gate and the floating gate, and the floating gate is disposed between the tunneling layer and the blocking layer.

As used herein, when an element, component or layer for example is described as being "on," "connected to," "coupled with," or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The foregoing detailed description has been presented for purposes of illustration and description. It is not intended to be exhaustive or to limit to the precise form disclosed. Many modifications and variations are possible in light of the above teaching. The described embodiments were chosen to best explain the principles and practical applications, to thereby enable others skilled in the art to best utilize the various embodiments and with various modifications as are suited to the particular use contemplated. It is intended that the scope be defined by the claims appended hereto.

The invention claimed is:

1. A non-volatile memory system comprising:
   a plurality of NAND strings of non-volatile storage elements, each non-volatile storage element comprising:
   a control gate;
   a tunneling layer;
   a floating gate; and a blocking layer comprising a ferroelectric material that includes doped hafnium oxide including crystal grains that may be switched between a first polarization state to a second polarization state,
wherein the tunneling layer is disposed between the control gate and the floating gate, and the floating gate is disposed between the tunneling layer and the blocking layer.

2. The non-volatile memory system of claim 1, wherein the blocking layer comprises hafnium oxide.

3. The non-volatile memory system of claim 1, wherein the blocking layer comprises hafnium oxide doped with one or more of silicon, aluminum, zirconium, yttrium, gadolinium, calcium, cerium, dysprosium, erbium, germanium, scandium, and tin.

4. The non-volatile memory system of claim 1, wherein the blocking layer comprises a combination of a ferroelectric dielectric material and one or more non-ferroelectric dielectric materials.

5. The non-volatile memory system of claim 1, further comprising a three-dimensional memory array, wherein the plurality of NAND strings reside in the three-dimensional memory array.

6. The non-volatile memory system of claim 1, further comprising a two-dimensional memory array, wherein the plurality of NAND strings reside in the two-dimensional memory array.

7. The non-volatile memory system of claim 1, wherein the blocking layer comprises hafnium oxide doped with silicon with a concentration of about 2 to about 5 atomic %.

8. The non-volatile memory system of claim 1, wherein the blocking layer comprises hafnium zirconium oxide, comprising a ratio of hafnium to zirconium atomic concentrations of 1 to 1.

9. The non-volatile memory system of claim 1, wherein the blocking layer comprises doped hafnium oxide comprising a crystalline or a polycrystalline morphology.

10. The non-volatile memory system of claim 1, wherein the blocking layer comprises a stacked blocking layer.

11. The non-volatile memory system of claim 1, wherein the blocking layer comprises a first blocking layer and a second blocking layer disposed on the first blocking layer.

12. The non-volatile memory system of claim 1, wherein the blocking layer comprises a first blocking layer comprising a non-ferroelectric dielectric material, and a second blocking layer that comprises the ferroelectric material.

13. The non-volatile memory system of claim 1, wherein the blocking layer comprises a first blocking layer comprising a first non-ferroelectric dielectric material, a second blocking layer that comprises the ferroelectric material, and a third blocking layer comprising a second non-ferroelectric dielectric material.

* * * * *